United States Patent
Kurosawa

(10) Patent No.: US 7,312,483 B2
(45) Date of Patent: Dec. 25, 2007

(54) THIN FILM TRANSISTOR DEVICE AND METHOD OF MANUFACTURING THE SAME

(75) Inventor: Yoshio Kurosawa, Kawasaki (JP)

(73) Assignee: Sharp Kabushiki Kaisha, Osaka (JP)

( * ) Notice: Subject to any disclaimer, the term of this patent is extended or adjusted under 35 U.S.C. 154(b) by 5 days.

(21) Appl. No.: 11/352,159

(22) Filed: Feb. 10, 2006

(65) Prior Publication Data

US 2006/0166413 A1 Jul. 27, 2006

Related U.S. Application Data

(62) Division of application No. 10/375,788, filed on Feb. 26, 2003, now Pat. No. 7,071,504.

(30) Foreign Application Priority Data

Feb. 28, 2002 (JP) ............................. 2002-53881

(51) Int. Cl.
*H01L 21/00* (2006.01)
(52) U.S. Cl. ................... 257/164; 257/149; 257/154; 257/480; 257/E21.135
(58) Field of Classification Search ............... None
See application file for complete search history.

(56) References Cited

U.S. PATENT DOCUMENTS 5,841,170 A   11/1998   Adan et al. ............ 257/345
5,879,974 A   3/1999    Yamazaki
5,898,188 A   4/1999    Koyama et al.
5,949,107 A   9/1999    Zhang
6,562,669 B2  5/2003    Suzawa et al. ......... 438/158
6,635,521 B2  10/2003   Zhang et al.
6,759,678 B2* 7/2004    Yamazaki et al. ........ 257/59
6,773,996 B2* 8/2004    Suzawa et al. ......... 438/279
7,141,822 B2* 11/2006   Nakamura et al. ........ 257/72
2002/0021378 A1* 2/2002  Murade ................. 349/43

FOREIGN PATENT DOCUMENTS

JP   63-012160   1/1988
JP   8-32078     2/1996

(Continued)

OTHER PUBLICATIONS

Partial English Translation of Japanese Office Action dated Jan. 16, 2007 in JP Apln No. 2002-053881.

*Primary Examiner*—Wai-Sing Louie
(74) *Attorney, Agent, or Firm*—Greer, Burns & Crain, Ltd.

(57) ABSTRACT

A semiconductor film is formed on a substrate. Subsequently, a resist film is formed on the semiconductor film, and dry etching is performed to the semiconductor film using the resist film as a mask. Due to the dry etching, the edge portion of the semiconductor film protrudes from the resist film. Next, the p-type impurities are introduced into the edge portion of the semiconductor film using the resist film as a mask. The volume density of the p-type impurities in a channel edge portion of the semiconductor film is two to five times the volume density of the p-type impurities in a channel center section. Subsequently, the resist film is removed to form a gate insulating film and a gate electrode.

15 Claims, 20 Drawing Sheets

FOREIGN PATENT DOCUMENTS

| | | |
|---|---|---|
| JP | 9-107100 | 4/1997 |
| JP | 9-191111 | 7/1997 |
| JP | 2000-31493 | 1/2000 |
| JP | 2000-77665 | 3/2000 |
| JP | 2000-196096 | 7/2000 |
| JP | 2000-349295 | 12/2000 |

* cited by examiner

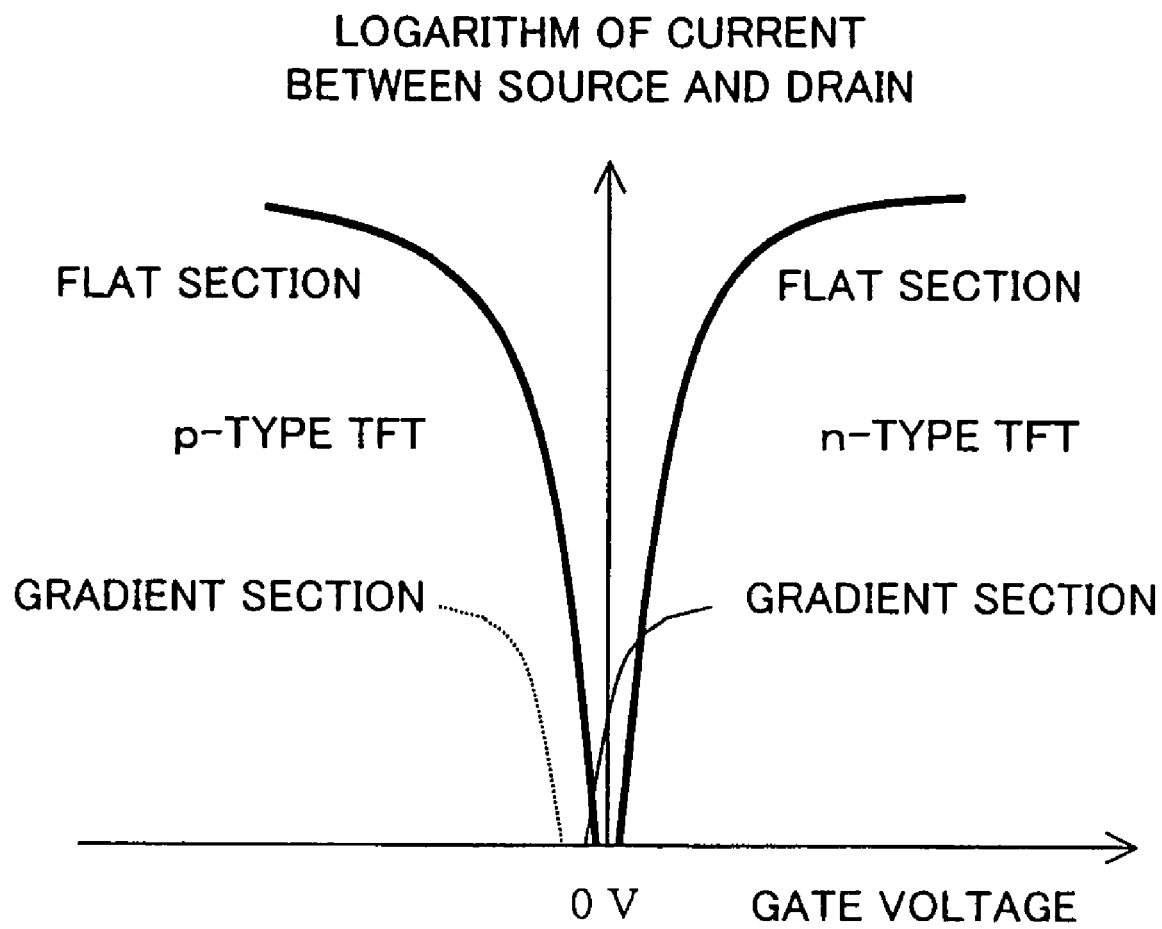

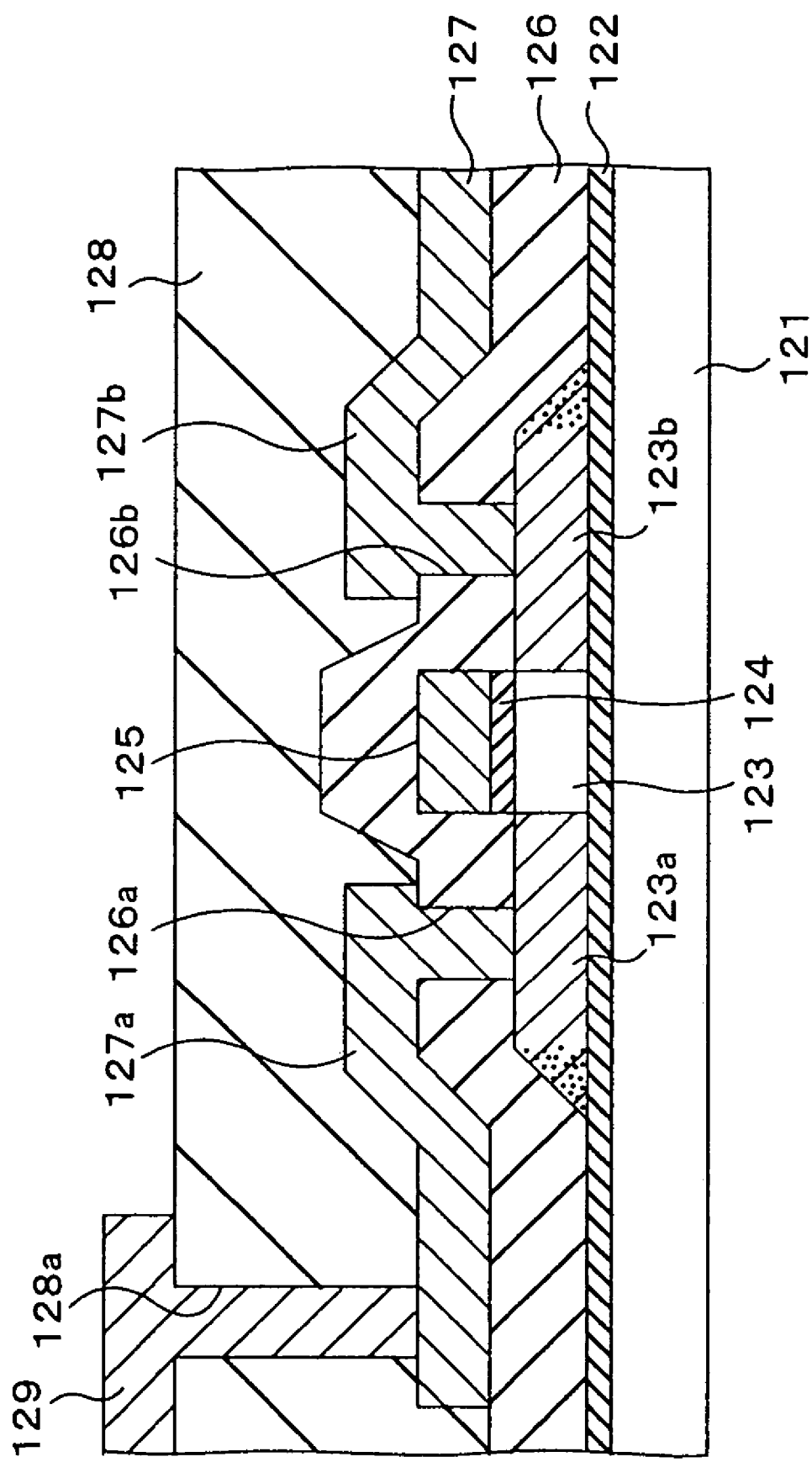

n-TYPE TFT FORMATION REGION p-TYPE TFT FORMATION REGION

THIN FILM TRANSISTOR DEVICE AND METHOD OF MANUFACTURING THE SAME

CROSS-REFERENCE TO RELATED APPLICATIONS

This is a divisional of application Ser. No. 10/375,788, filed Feb. 26, 2003, now U.S. Pat. No. 7,071,504.

This application is based upon and claims priority of Japanese Patent Application No. 2002-053881, filed on Feb. 28, 2002, the contents being incorporated herein by reference.

BACKGROUND OF THE INVENTION

1. Field of the Invention

The present invention relates to a thin film transistor device in which thin film transistors using film of amorphous silicon, polysilicon or other semiconductor for an active layer are integrated and a method of manufacturing the device.

2. Description of the Prior Art

In recent years, a display for personal computers and a television, which use a liquid crystal display panel, have been generally used. The liquid crystal display panel is also used for a display of cell phones, PDAs (Personal Digital Assistant), and the like. Further, development of an organic EL display panel, which can save more power than the liquid crystal display panel, is in progress as well in recent years, and the organic EL display panel has already been commercialized in some products.

In the liquid crystal display panel and the organic EL display panel, a large numbers of picture elements (sub pixels) are generally arrayed in a matrix state, and each picture element is provided with a thin film transistor (hereinafter, also referred to as TFT) as a switching element. A display panel having such a structure is referred to as an active matrix display panel.

A general TFT is provided with a semiconductor film formed on an insulated substrate, a gate insulating film formed on the semiconductor film, and a gate electrode formed on the gate insulating film. However, positions of the gate electrode and the semiconductor film are opposite in the case of an inversely staggered TFT.

When an amorphous silicon film is used as the semiconductor film, it is necessary that an IC (Integrated Circuit) for panel driving be connected outside the display panel and the IC for panel driving drive the display panel because carrier mobility of amorphous silicon is small. On the other hand, when a polysilicon film is used as the semiconductor film, a drive circuit constituted by TFTs can be integrally formed on the display panel because carrier mobility of the polysilicon film is large. This reduces the number of parts and the number of manufacturing processes of an apparatus using the display panel, and a product cost can be reduced.

FIGS. 1A to 1C are views showing the structure of a conventional TFT, where FIGS. 1A, 1B and 1C are a plan view of the TFT, a sectional view at I-I line in FIG. 1A, and a sectional view at II-II line in FIG. 1A, respectively.

A silicon oxide film as an underlying insulating film 11 is formed on a glass substrate (insulated substrate) 10. The polysilicon film as a semiconductor film 12 is formed on a TFT formation region of the underlying insulating film 11.

The silicon oxide film as a gate insulating film 13 is formed on the underlying insulating film 11 and the semiconductor film 12, and a gate electrode 14 made of metal is formed on the gate insulating film 13. The gate electrode 14 is formed so as to cross above the semiconductor film 12.

A pair of highly concentrated impurity regions (source/drain regions) 12a, 12b, which have been formed by implanting p-type or n-type impurities using the gate electrode 14 as a mask, are provided for the semiconductor film 12.

Incidentally, in the case of the TFT, where the semiconductor film 12 is made up of polysilicon and the gate insulating film 13 is made up of silicon oxide as shown in this example, it is known that a threshold voltage is negative (a few −V) if dopant (impurities) is not added at all to a channel region of the semiconductor film 12.

Since CMOS (Complimentary Metal Oxide Semiconductor) where the p-type TFT and the n-type TFT are arranged in a pair is used in the drive circuit of the display panel, a leakage current occurs to increase power consumption unless the threshold value voltage is adjusted such that both of the p-type TFT and the n-type TFT are turned off when a gate voltage is 0V. For this reason, the p-type impurities such as boron (B) is introduced into the entire semiconductor film 12 before forming the gate electrode 14 to control the threshold voltage such that both the p-type TFT and the n-type TFT are turned off when the gate voltage is 0V.

There exist an ion implantation method, an ion doping method, and a vapor-phase doping method, for example, as a method to introduce the p-type impurities into the semiconductor film 12. Note that, in the present invention, a method in which mass separation is performed and only a target ion is implanted into the semiconductor film is referred to as the ion implantation method, and a method in which the impurities are accelerated without performing mass separation and implanted into the semiconductor film is referred to as the ion doping method. As the ion doping method, there exists a method in which material gas such as diborane ($B_2H_6$), for example, is excited by RF (Radio Frequency) power to generate boron ion and the boron ion is accelerated into energy having a few keV to 100 keV to be implanted into the semiconductor film. Further, as the ion doping method, there exists a method in which ion is generated by ark discharge using filament instead of the above-described RF electric power and the ion is accelerated to be implanted into the semiconductor film, or a method in which ion beam generated by the ark discharge is implanted into the semiconductor film while scanning the beam.

The following method is used in the case of forming the polysilicon film containing boron (B) as the p-type impurities by the vapor-phase doping method.

First, after having formed the underlying insulating film 11 on the substrate 10, the amorphous silicon film is formed on the underlying insulating film 11 by a plasma CVD (Chemical Vapor Deposition) method. At this point, diborane ($B_2H_6$) gas is mixed into silane ($SiH_4$) gas, which is a material, to form the amorphous silicon film containing boron (B).

Subsequently, laser is irradiated onto the amorphous silicon film to transform the silicon into polycrystalline. Thus, the polysilicon film containing boron is obtained. Then, patterning is performed to the polysilicon film into a predetermined shape.

In the vapor-phase doping method, boron quantity per unit volume (volume density) in a film thickness direction of the semiconductor film becomes uniform.

The following method is used in the case of forming the polysilicon film into which the p-type impurities have been introduced by the ion implantation method or the ion doping method.

First, after having formed the underlying insulating film 11 on the substrate 10, the amorphous silicon film is formed on the underlying insulating film 11 by the plasma CVD method. Subsequently, laser is irradiated onto the amorphous silicon film to transform the silicon into polycrystalline, and the polysilicon film is obtained.

Next, patterning is performed to the polysilicon film into a predetermined shape by the photolithography method. Then, ion implantation or ion doping of boron (B) as the p-type impurities, for example, are performed to the polysilicon film.

However, the inventors think that the above-described conventional manufacturing method of TFT has the following problems.

Generally, in the TFT used in the liquid crystal display panel or the like, the edge portion of the semiconductor film is processed so as to have gradient as shown in FIG. 1C for the purpose of securing withstand voltage for the gate insulating film 13. (refer to Patent Application Publication (KOKAI) 2000-31493, for example). Hereinafter, the gradient portion of the silicon film is referred to as a gradient section.

As described above, since the boron quantity per unit volume (volume density) in the film thickness direction of the semiconductor film is uniform in the vapor-phase doping method, the boron quantity (surface density) per unit area of the gradient section in the channel region is smaller than that of a central section (hereinafter, also referred to as a flat section) of the channel region when the TFT is viewed from above. Accordingly, the threshold voltage at the gradient section becomes lower than the threshold value voltage at the flat section by approximately −1V to −2V.

FIG. 2 is the view schematically showing the current-voltage characteristic (I-V characteristic) of the conventional TFT (n-type TFT and p-type TFT). As shown in FIG. 2, the gradient section of the n-type TFT has a small channel width and becomes a parasitic transistor with a low threshold value voltage, and the current actually flowing in the TFT is one where the characteristic of the gradient section is added to the characteristic of the flat section, which is the characteristic having a so-called hump. Note that, in the p-type TFT, the characteristic of the gradient section is masked by the characteristic of the flat section, and a change of the threshold voltage due to the influence of the gradient section does not occur.

In the case where the n-type TFT and the p-type TFT having such characteristics constitute the CMOS, it is difficult to control a doping quantity of the p-type impurities into the semiconductor film such that both TFTs are turned off when the gate voltage is 0V because the threshold of the n-type TFT and the threshold of the p-type TFT are close.

Although distribution of the p-type impurities are not uniform in the thickness direction of the semiconductor film when the polysilicon film, into which the p-type impurities was introduced by the ion implantation method or the ion doping method, has been formed, the surface density of the p-type impurities of the gradient section becomes smaller than that of the flat section, which is the same as the case of the vapor-phase doping method. Furthermore, a problem similar to the one described above occurs in the inverted staggered TFT as well when the edge portion of the semiconductor film is gradient.

Note that Patent Application Publication (KOKAI) 2000-77665 proposes that ion implantation of Ar be performed to the edge portion of the polysilicon film to give damage thereto into an amorphous state, and a drive capability of the parasitic transistor be reduced. However, it is considered that annealing in a post-process causes recrystallization depending on the concentration of Ar and the influence of the edge portion may appear.

SUMMARY OF THE INVENTION

The object of the present invention is to provide a thin film transistor device in which both the n-type TFT and the p-type TFT are turned off at a predetermined gate voltage (0V for example) and the power consumption can be reduced compared to the conventional device, and a method of manufacturing the device.

The thin film transistor device according to the first aspect of the present invention comprises: a substrate; and a thin film transistor formed above the substrate and has a semiconductor film, where the p-type impurities have been introduced in the channel region, as the operation layer, in which the gradient is provided for the edge portion of the semiconductor film and the volume density of the p-type impurities in the edge portion of the channel region is twice to five times the volume density of the p-type impurities in the central section of the channel region.

In the present invention, the volume density of the p-type impurities in the edge portion of the channel region is as high as twice to five times the volume density of the p-type impurities in the central section of the channel region. This makes the surface density of the p-type impurities in the edge portion of the channel region become substantially equal to the surface density of the p-type impurities in the central section of the channel region, and the threshold voltage of the parasitic transistor formed at the gradient section increases. As a result, the hump in the I-V characteristic of the n-type thin film transistor disappears, and both the n-type thin film transistor and the p-type thin film transistor can be turned off at the predetermined gate voltage.

The method of manufacturing the thin film transistor according to the second aspect of the present invention comprises the steps of: forming the semiconductor film, into which the p-type impurities have been introduced, above the substrate; forming a resist film on a thin film transistor formation region of the semiconductor film; etching in which the semiconductor film is etched using the resist film as a mask; introducing the p-type impurities into a portion of the semiconductor film, which protrudes from the resist film, using the resist film as a mask; removing the resist film; forming the gate insulating film; and forming the gate electrode.

In the present invention, after having formed the semiconductor film above the substrate and having formed the resist film on the semiconductor film, dry etching using gas containing $SF_6$ and oxygen, for example, is performed to the semiconductor film using the resist film as a mask. At this point, when a positive type resist is used, for example, the edge portion of the resist film generally has gradient such that the width becomes smaller from the bottom portion to the upper portion. Then, the edge portion of the resist film withdraws with the progress of etching to the semiconductor film, and the edge portion of the semiconductor film protrudes from the resist film. Further, the portion of the semiconductor film, which has protruded from the resist film becomes gradient.

Subsequently, the p-type impurities are introduced into the edge portion (gradient section) of the semiconductor film using the resist film as a mask. Thus, the semiconductor film having higher volume density of the p-type impurities in the edge portion than the volume density of the p-type impurities in the central section is obtained. In the case of a coplanar TFT, after having removed the resist film subsequently, the gate insulating film and the gate electrode are formed on the semiconductor film. The thin film transistor without a hump in the I-V characteristic can be formed in this manner. Note that the semiconductor film is formed after having formed the gate electrode and the gate insulating film in the case of the inversely staggered TFT.

The method of manufacturing the thin film transistor according to the third aspect of the present invention comprises the steps of: forming the semiconductor film, into which the p-type impurities have been introduced, above the substrate; forming a mask film on the semiconductor film; forming the resist film on the thin film transistor formation region of the mask film; etching the mask film and the semiconductor film using the resist film as a mask; removing the resist film; introducing the p-type impurities into a portion of the semiconductor film, which has protruded from the mask film, using the mask film as a mask; forming the gate insulating film; and forming the gate electrode.

In the present invention, the mask film is formed on the semiconductor film, and the resist film is further formed thereon. Then, dry etching, for example, is performed to the semiconductor film and the mask film using the resist film as a mask. In this step, the edge portion of the resist film has gradient and the edge portion of the resist film withdraws with progress of etching. Then, the edge portion of the semiconductor film protrudes from the resist film and the mask film.

Subsequently, the resist film is removed, and the p-type impurities are introduced into the edge portion of the semiconductor film using the mask film as a mask. Thus, the semiconductor film having higher volume density of the p-type impurities in the edge portion than the volume density of the p-type impurities in the central section is obtained.

In the present invention, the resist film can be removed by remover because the impurities are not implanted into the resist film. Accordingly, operation is easier comparing with the case where the resist film is removed by ashing.

The method of manufacturing the thin film transistor according to the fourth aspect of the present invention comprises the steps of: forming the semiconductor film above the substrate; forming the mask film on the semiconductor film; forming the resist film on the thin film transistor formation region of the mask film; etching the mask film and the semiconductor film using the resist film as a mask; removing the resist film; introducing the p-type impurities into the entire semiconductor film on condition that the impurities transmit through the mask film; introducing the p-type impurities into only a part of the semiconductor film, which has protruded from the mask film, on condition that the impurities are blocked by the mask film; forming the gate insulating film; and forming the gate electrode. Note that the order of the step of introducing the p-type impurities into the entire semiconductor film on condition that the impurities transmit through the mask film and the step of introducing the p-type impurities into only a part of the semiconductor film, which has protruded from the mask film, on condition that the impurities are blocked by the mask film may be opposite.

In the present invention, the mask film is formed on the semiconductor film, and the resist film is formed on the mask film. Then, etching is performed to the semiconductor film and the mask film using the resist film as a mask. Thus, the semiconductor film protrudes from the resist film. Subsequently, after having removed the resist film, the p-type impurities are introduced into the entire semiconductor film on condition that the impurities transmit through the mask film, and furthermore, the p-type impurities are introduced into only a part of the semiconductor film, which has protruded from the mask film, on condition that the impurities are blocked by the mask film. With this procedure, the semiconductor film having higher volume density of the p-type impurities in the edge portion than the volume density of the p-type impurities in the central section.

The thin film transistor device according to the fifth aspect of the present invention comprises: the substrate; and a thin film transistor that is formed above the substrate and has a semiconductor film, where the p-type impurities have been introduced at least into the channel region, as the operation layer, in which the gradient is provided for the edge portion of the semiconductor film and the p-type impurities have been introduced into the channel region of the semiconductor film such that a peak of distribution appears in the vicinity of the surface.

In the present invention, since the p-type impurities have been introduced into the channel region of the semiconductor film such that the peak of distribution appears in the vicinity of the surface, the surface density of the p-type impurities when the thin film transistor is viewed from above becomes substantially the same in the edge portion and the central section of the channel region. Although the surface density is low at a gradient tip portion of a channel edge portion because a film thickness becomes thin, electric current that flows in this portion is small as well and formation of the hump in the I-V characteristic is avoided.

Accordingly, both the n-type thin film transistor and the p-type thin film transistor can be turned off at the predetermined gate voltage.

The method of manufacturing the thin film transistor according to the sixth aspect of the present invention comprises the steps of: forming the semiconductor film above the substrate; forming the resist film on the thin film transistor formation region of the semiconductor film; etching the semiconductor film using the resist film as a mask; removing the resist film; introducing the p-type impurities into the semiconductor film on condition that the peak of distribution appears in the vicinity of the surface of the semiconductor film; forming the gate insulating film; and forming the gate electrode.

In the present invention, since the p-type impurities are introduced into the semiconductor film on condition that the peak of distribution appears in the vicinity of the surface of the semiconductor film, the surface density of the p-type impurities becomes substantially the same in the edge portion and the central section of the channel region. Accordingly, both the n-type thin film transistor and the p-type thin film transistor can be turned off at the predetermined gate voltage.

The thin film transistor device according to the seventh aspect of the present invention comprises: the substrate; and the p-type thin film transistor and the n-type thin film transistor, which are formed above the substrate, in which both the p-type thin film transistor and the n-type thin film transistor have the semiconductor film, which is provided with the gradient at the edge portion, as the operation layer, the volume density of the p-type impurities contained in the channel region of the semiconductor film of the n-type thin film transistor is higher than the volume density of the p-type impurities in the channel region of the semiconductor film of the p-type thin film transistor, and the volume density of the p-type impurities in the gradient section of the channel region of the n-type thin film transistor is twice or more the volume density of the p-type impurities in the central section of the channel region.

In the present invention, the impurities are introduced into the gradient section of the channel region of the n-type thin film transistor in the volume density of twice or more that of the central section of the channel region. Further, more quantity of the p-type impurities are introduced into the channel region of the n-type thin film transistor than the channel region of the p-type thin film transistor.

Thus, the threshold of the n-type thin film transistor increases, and the difference between the thresholds of the p-type thin film transistor and the n-type thin film transistor becomes larger. As a result, implantation quantity of impurities for threshold control is easily controlled, and both the n-type thin film transistor and the p-type thin film transistor can be turned off at the predetermined gate voltage.

The method of manufacturing the thin film transistor according to the eighth aspect of the present invention comprises the steps of: forming the semiconductor film, into which the p-type impurities have been introduced, above the substrate; forming the mask film on the semiconductor film; forming a first resist film on a p-type thin film transistor formation region and an n-type thin film transistor formation region of the mask film; etching the semiconductor film and the mask film using the first resist film as a mask; removing the first resist film; covering the p-type thin film transistor formation region above the substrate with a second resist film; introducing the p-type impurities into the entire semiconductor film of the n-type thin film transistor formation region on condition that the impurities transmit through the mask film, and introducing the p-type impurities into a part of the semiconductor film in the n-type thin film transistor formation region, which has protruded from the mask film, on condition that the impurities are blocked by the mask film; removing the second resist film; forming the gate insulating film; and forming the gate electrode.

In the present invention, after having formed the semiconductor film and the mask film above the substrate, etching is performed to the semiconductor film and the mask film using the first resist film as a mask. In this step, the edge portion of the semiconductor film becomes gradient and the gradient portion protrudes from the resist film and the mask film. Subsequently, after having removed the first resist film, the second resist film that covers the p-type thin film transistor formation region is formed. Then, the p-type impurities are introduced into the entire semiconductor film in the n-type thin film transistor formation region on condition that the impurities transmit through the mask film. Moreover, the p-type impurities are introduced into a part of the semiconductor film, which has protruded from the mask film, on condition that the impurities are blocked by the mask film. Accordingly, the hump in the I-V characteristic of the n-type thin film transistor disappears, and the difference between the threshold of the p-type thin film transistor and the threshold of the n-type thin film transistor becomes larger. As a result, both the n-type thin film transistor and the p-type thin film transistor can be turned off at the predetermined gate voltage.

Note that, in the present invention, the order of the step of introducing the p-type impurities into the entire semiconductor film and the step of introducing the p-type impurities into a part of the semiconductor film, which has protruded from the mask film, may be executed in an opposite order.

BRIEF DESCRIPTION OF THE DRAWINGS

FIG. 2 is a view schematically showing the I-V characteristic of a conventional TFT (n-type TFT and p-type TFT).

FIG. 7 is a sectional view of FIG. 6 at III-III line.

DESCRIPTION OF THE PREFERRED EMBODIMENTS

In the following, embodiments of the present invention will be described with reference to the accompanying drawings.

First Embodiment

Figure 1A:
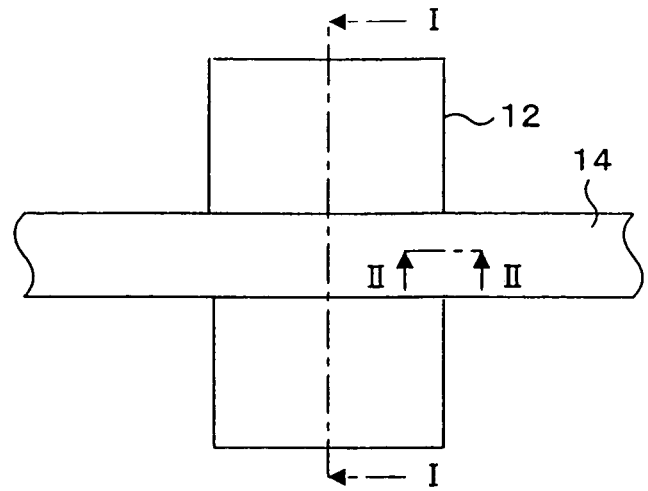
FIGS. 1A, 1B, and 1C are a plan view of a TFT, a sectional view of FIG. 1A at I-I line, and a sectional view of FIG. 1A at II-II line, respectively.
Figure 1B:
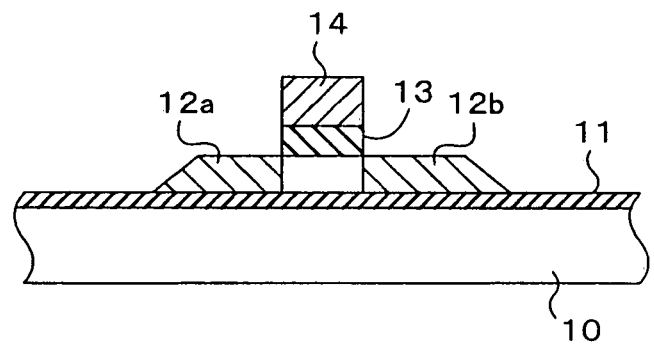
Figure 1C:
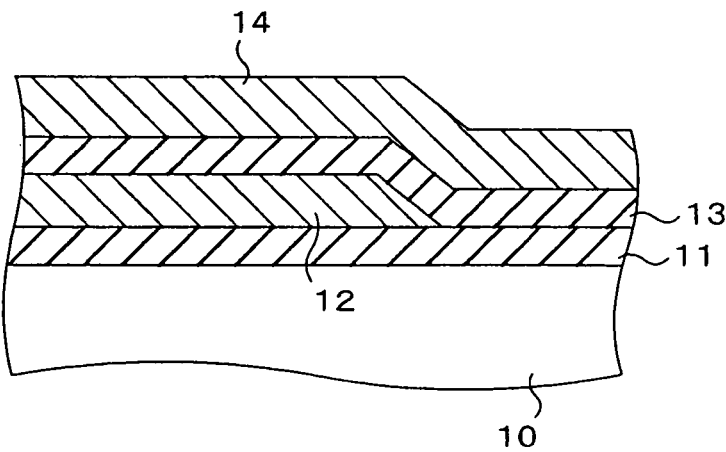
Figure 3:
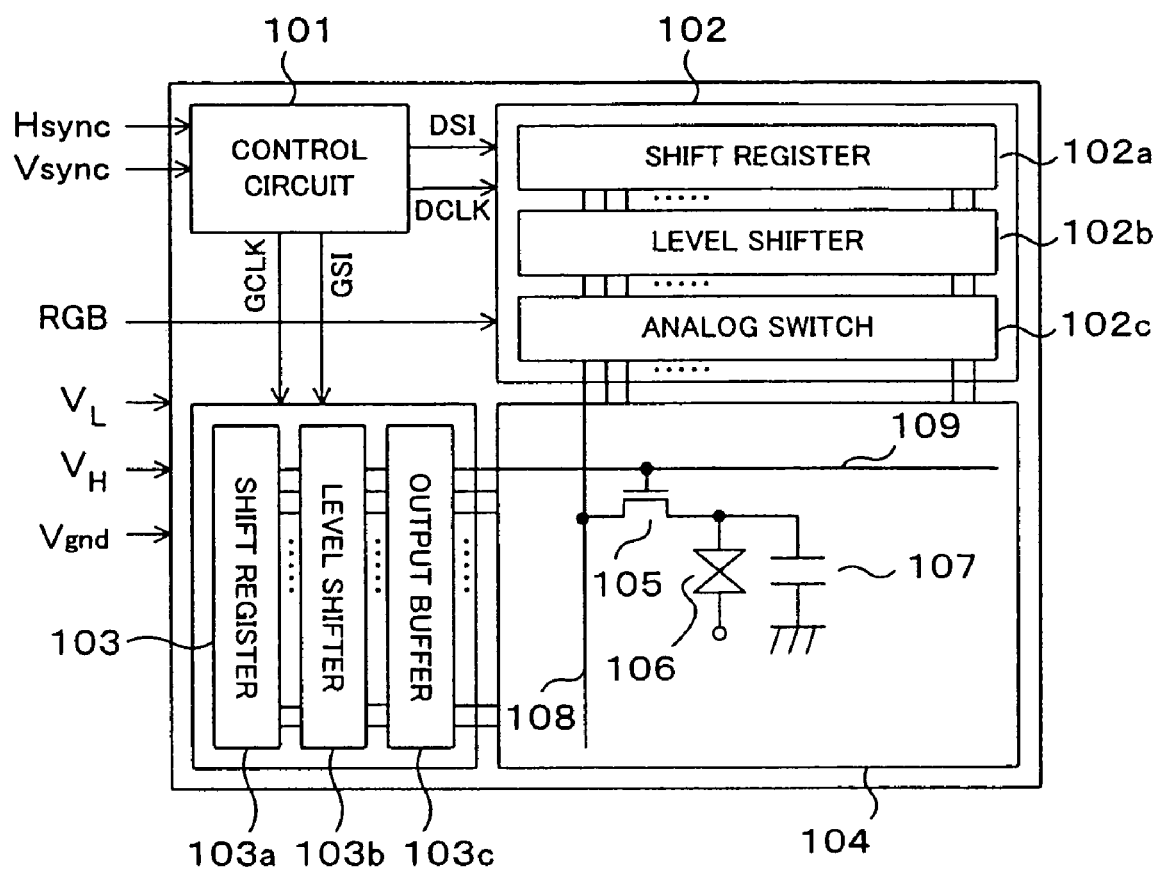
FIG. 3 is a block diagram showing a constitution of the thin film transistor device (transmissive liquid crystal display panel) of the first embodiment of the present invention.

FIG. 3 is the block diagram showing a constitution of the thin film transistor device (a transmissive liquid crystal display panel) of the first embodiment of the present invention. Note that description will be made for the liquid crystal display panel having an XGA (1024×768 pixels) mode.

The liquid crystal display panel of this embodiment is provided with a control circuit 101, a data driver 102, a gate driver 103, and a display section 104. An external device (not shown) such as a computer supplies signals such as display signal RGB (R: red signal, G: green signal, B: blue signal), horizontal synchronizing signal (Hsync), and vertical synchronizing signal (Vsync), and a power source (not shown) supplies high voltage VH (18V, for example), low voltage VL (3.3V or 5V, for example), and ground potential Vgnd to the liquid crystal display panel.

Picture elements (sub pixels) of 3072 (1024×RGB) pieces in a horizontal direction and 768 pieces in a vertical direction are arrayed on the display section 104. One picture element is provided with an n-type TFT 105, a display cell 106 connected to the source electrode of the n-type TFT 105, and a storage capacitor 107. The display cell 106 is provided with a pair of electrodes, liquid crystal between the electrodes, a polarizer and a color filter respectively arranged on and under a pair of the electrode, and the like.

Further, 3072 data bus lines 108 extending in a vertical direction and 768 gate bus lines 109 extending in a horizontal direction are provided for the display section 104. The gate electrode of each TFT 105 of picture elements arrayed in a horizontal direction is connected to the same gate bus line 109, and a drain electrode of each TFT 105 arrayed in a vertical direction is connected to the same data bus line 108.

The control circuit 101 receives the horizontal synchronizing signal (Hsync) and the vertical synchronizing signal (Vsync), and outputs data start signal DSI activated at a starting point of one horizontal synchronizing period, data clock DCLK that divides one horizontal synchronizing period into regular intervals, gate start signal GSI activated at a starting point of one vertical synchronizing period, and gate clock GCLK that divides one vertical synchronizing period into regular intervals.

The data driver 102 is provided with a shift register 102a, a level shifter 102b, and an analog switch 102c.

The shift register 102a has 3072 pieces of output terminals. The shift register 102a is initialized by the data start signal DSI, and sequentially outputs low-voltage active signal from each output terminal with timing synchronous with the data clock DCLK.

The level shifter 102b includes 3072 pieces of input terminals and 3072 pieces of output terminals. The level shifter 102b converts the low-voltage active signal output from the shift resister 102a into high-voltage and outputs it.

The analog switch 102c also includes 3072 pieces of input terminals and 3072 pieces of output terminals. Each output terminal of the analog switch 102c is severally connected to a corresponding data bus line 108. When the analog switch 102c has received the active signal from the level shifter 102b, it outputs the display signal RGB (any one of R signal, G signal, and B signal) to an output terminal corresponding to the input terminal that has received the active signal.

Specifically, the data driver 102 outputs the R signal, the G signal, and the B signal sequentially to the 3072 data bus lines 108 of the display section 104 in timing synchronous with the data clock DCLK in one horizontal synchronizing period.

The gate driver 103 is provided with a shift register 103a, a level shifter 103b, and an output buffer 103c.

The shift register 103a has 768 pieces of output terminals. The shift register 103a is initialized by the gate start signal GSI, and sequentially outputs low-voltage scanning signal from each output terminal with timing synchronous with the gate clock GCLK.

The level shifter 103b includes 768 pieces of input terminals and 768 pieces of output terminals. Then, the level shifter 103b converts the low-voltage scanning signal received from the shift resister 103a into high-voltage and outputs it.

The output buffer 103c also includes 768 pieces of input terminals and 768 pieces of output terminals. Each output terminal of the output buffer 103c is severally connected to a corresponding gate bus line 109. The output buffer 103c supplies the scanning signal received from the level shifter 103b to the gate bus line 109 via an output terminal corresponding to the input terminal.

Specifically, the gate driver 103 supplies the scanning signal sequentially to the 768 gate bus lines 109 of the display section 104 in timing synchronous with the gate clock GCLK in one vertical synchronizing period.

The TFTs 105 of the display section 104 turn on when the scanning signal is supplied to the gate bus lines 109. At this point, when the display signal RGB (any one of R signal, G signal, and B signal) is supplied to the data bus lines 108, the display signal RGB is written to the display cells 106 and the storage capacitors 107. In the display cells 106, orientation of liquid molecules change due to the display signal RGB that has been written, and light transmittance of the display cells 106 changes as a result. By controlling the light transmittance of the display cells 106 for each picture element, a desired image is displayed.

In this embodiment, the TFTs 105 in the picture elements are the n-type as described above. Further, the control circuit 101, the data driver 102, and the gate driver 103 are provided with the p-type TFTs and the n-type TFTs.

Figure 4:
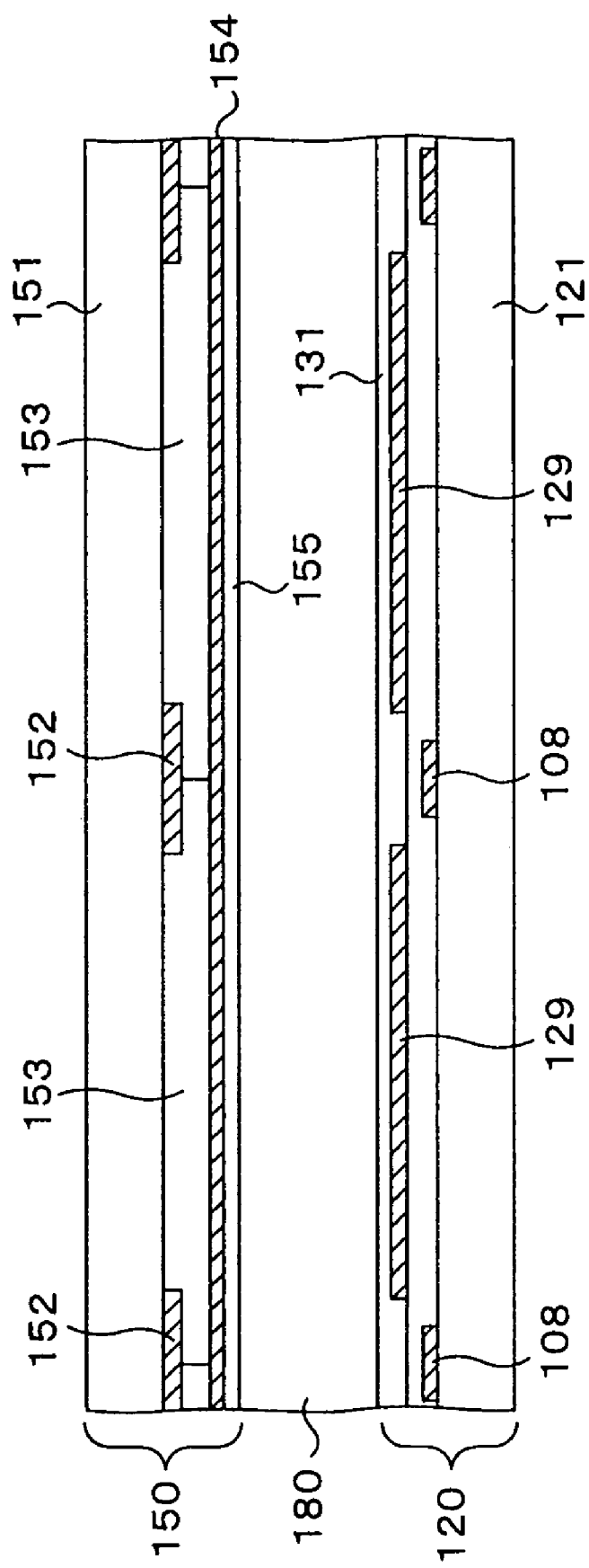
FIG. 4 is a sectional view of a display section of the liquid crystal display panel of the first embodiment of the present invention.
Figure 5:
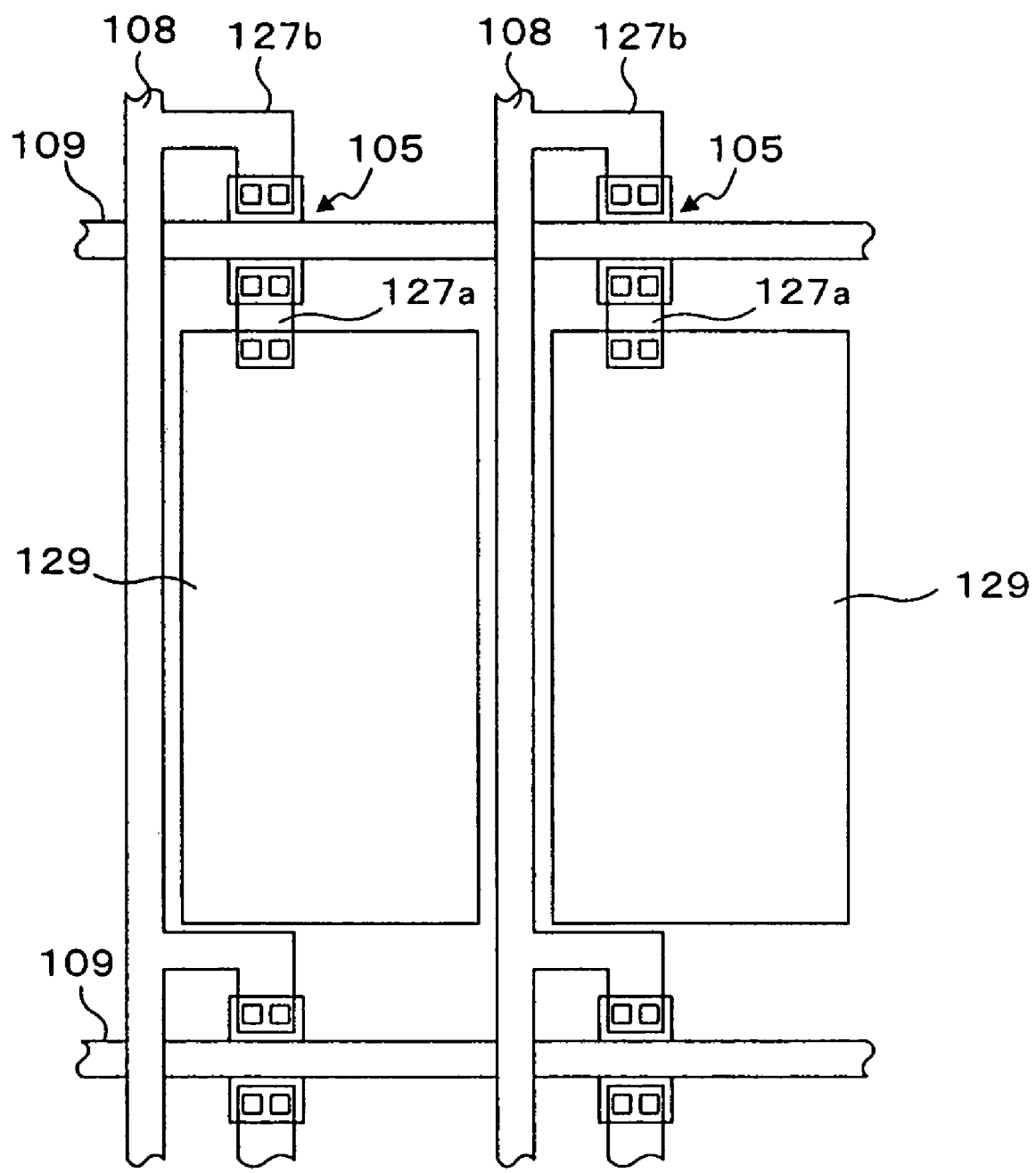
FIG. 5 is a plan view of a TFT substrate on the display section.

FIG. 4 is the sectional view of the display section of the liquid crystal display panel of the first embodiment of the present invention, and FIG. 5 is the plan view of the TFT substrate on the display section. Although the storage capacitor 107 shown in FIG. 3 is actually formed in each picture element, illustration and description thereof are omitted here.

The liquid crystal display panel of this embodiment is provided with a TFT substrate 120 and a CF substrate 150 arranged opposing to each other, and liquid crystal 180 filled between the TFT substrate 120 and the CF substrate 150 as shown the sectional view of FIG. 4.

The TFT substrate 120 is provided with a glass substrate (a transparent insulated substrate) 121, and the data bus lines 108, the gate bus lines 109, the TFTs 105, picture element electrodes 129 and the like, which have been formed on the glass substrate 121. In this embodiment, a part of the gate bus line 109 is a gate electrode of the TFT 105 as shown in FIG. 5, and a source electrode 127a for the TFT 105 is connected to the picture element electrode 129, and a drain electrode 127b is connected to the data bus line 108. Further, an alignment film 131 is formed on the picture element electrodes 129.

Moreover, the n-type TFTs, the p-type TFTs, wirings, and the like are formed outside the display section of the TFT substrate 120, which constitute the control circuit 101, the data driver 102, and the gate driver 103 (drive circuit).

On the other hand, the CF substrate 150 is provided with a glass substrate (transparent insulated substrate) 151, a black matrix 152 formed on the glass substrate 151, a color filter 153, and a common electrode 154. The black matrix 152 is formed so as to cover the region among the picture elements and the TFT formation region. Further, the color filter 153 having any one of red, green and blue is formed on each picture element. In this embodiment, the common electrode 154 is formed on the color filter 153, and the surface of the common electrode 154 is covered with an orientation film 155.

The TFT substrate 120 and the CF substrate 150 are arranged by making the surfaces, on which the alignment films (131, 155) have been formed, oppose to each other.

Figure 6:
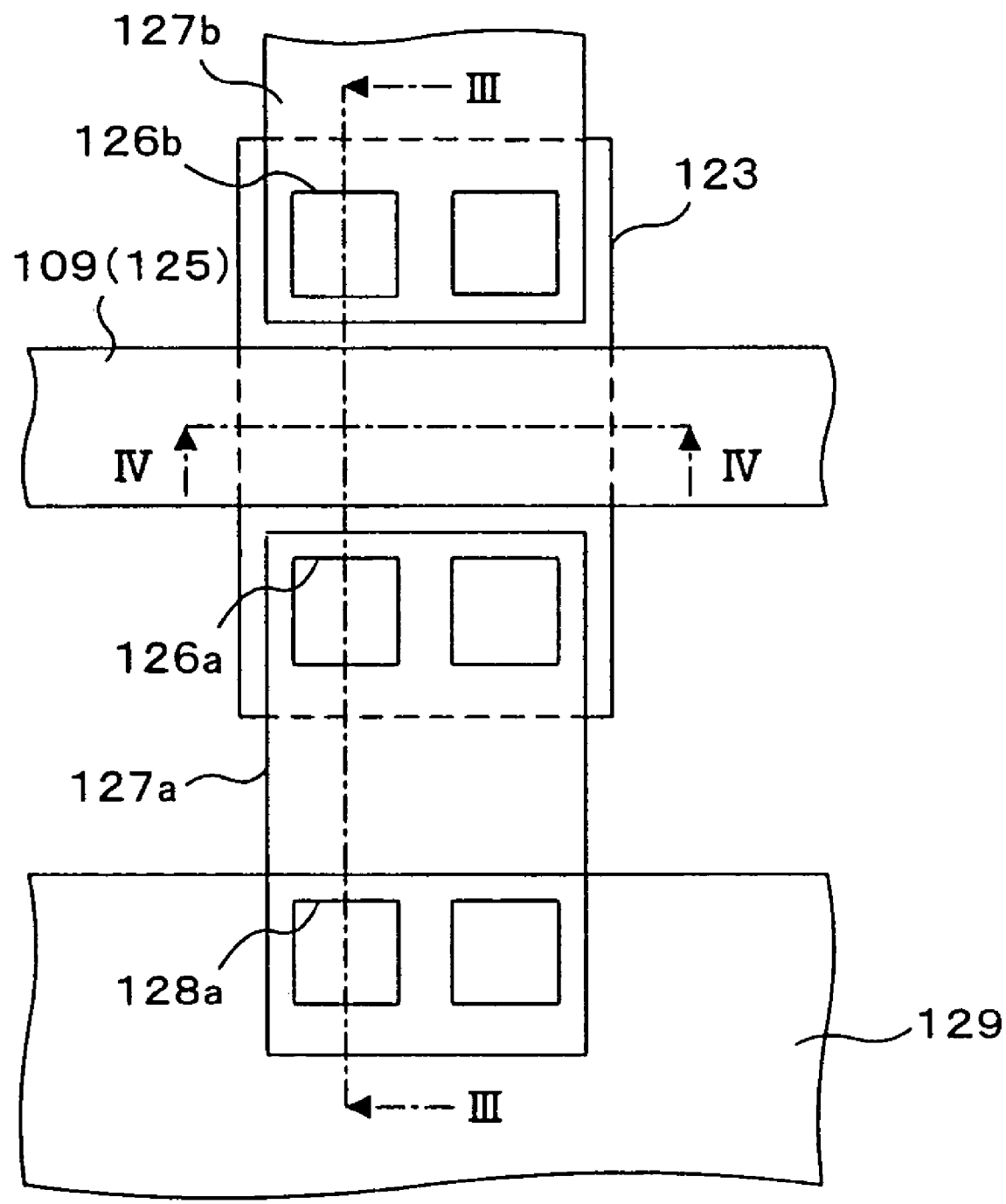
FIG. 6 is a plan view of the TFT formation section.

FIG. 6 is the plan view of the TFT formation section, and FIG. 7 is the sectional view of FIG. 6 at the position of III-III line. Description will be further made for the constitution of the TFT substrate 120 referring to FIG. 6 and FIG. 7. Note that illustration of the alignment film 131 is omitted in FIGS. 6 and 7.

An underlying insulating film 122 is formed on the glass substrate 121. A polysilicon film 123, which is the operation layer for the TFTs 105, is formed on a predetermined region of the underlying insulating film 122.

A pair of high-concentration impurity regions (123a, 123b), which are source/drain for TFTs 105, are formed in the polysilicon film 123 sandwiching the channel region. In this embodiment, the gradient is provided for the edge portion of the polysilicon film 123, as shown in FIG. 7. Then, the p-type impurities are introduced into the channel region of the polysilicon film 123 for controlling the threshold value, and the p-type impurities are introduced into the edge portion (gradient section) of the polysilicon film 123 in the volume density twice to five times that of the central section (flat section) of the channel region.

A gate insulating film 124 is formed on the channel region of the polysilicon film 123, and a gate electrode 125 (gate bus line 109) is formed on the gate insulating film 124.

A first interlayer insulating film 126 is formed on the underlying insulating film 122 and the gate electrode 125 (gate bus line 109). A source electrode 127a, a drain electrode 127b, and the data bus line 108 are formed on the first interlayer insulating film 126. The source electrode 127a is electrically connected to the high-concentration impurity region 123a via a contact hole 126a provided for the first interlayer insulating film 126, and the drain electrode 127b is electrically connected to the high-concentration impurity region 123b via a contact hole 126b provided for the first interlayer insulating film 126.

A second interlayer insulating film 128 is formed on the first interlayer insulating film 126, the data bus line 108, the source electrode 127a, and the drain electrode 127b, and the picture element electrode 129 made up of transparent conductor such as ITO (Indium-Tin Oxide) is formed on the second interlayer insulating film 128. The picture element electrode 129 is electrically connected to the source electrode 127a via a contact hole 128a provided for the second interlayer insulating film 128.

FIGS. 8A to 8E and FIGS. 9A to 9E are the sectional views showing the manufacturing method of the TFT substrate having the above-described structure in the order of process. Note that FIGS. 8A to 8E show the sectional views of FIG. 6 at the position of III-III line, and FIGS. 9A to 9E show the sectional views of FIG. 6 at the position of IV-IV line.

Figure 8A:
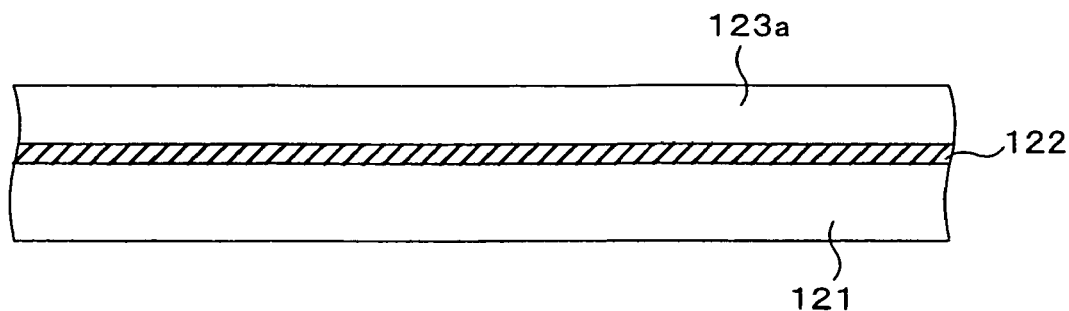
FIGS. 8A to 8E are sectional views showing a manufacturing method of the TFT substrate according to the first embodiment, and are sectional views of FIG. 6 at the position of III-III line.
Figure 9A:
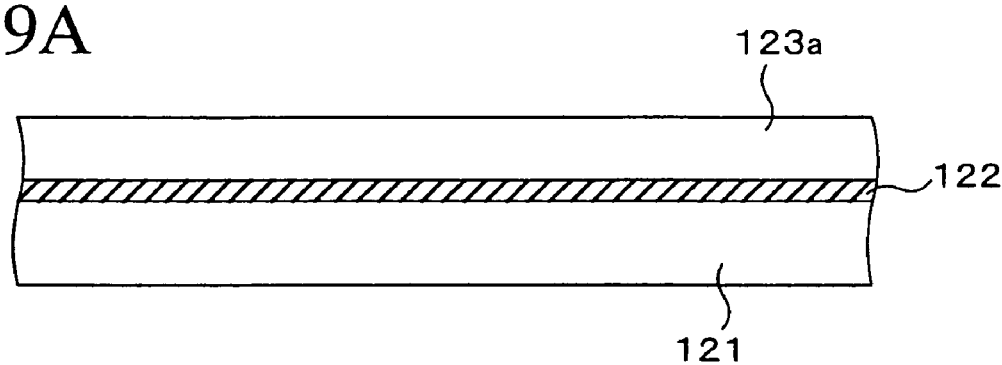
FIGS. 9A to 9E are sectional views showing manufacturing method of the TFT substrate according to the first embodiment, and are sectional views of FIG. 6 at the position of IV-IV line.

First, as shown in FIGS. 8A and 9A, the glass substrate 121 as the insulated substrate is prepared, an underlying insulating film 122 made up of silicon oxide film ($SiO_2$), for example, is formed on the glass substrate 121 in the thickness of approximately 100 nm. Subsequently, an amorphous silicon film 123a containing boron (B), which is the p-type impurities, is formed on the underlying insulating film 122 in the thickness of approximately 40 nm by the vapor-phase doping method using a CVD system. The volume density of boron in the amorphous silicon film 123a is set to $4 \times 10^{17}$ $cm^{-3}$, for example.

Figure 8B:
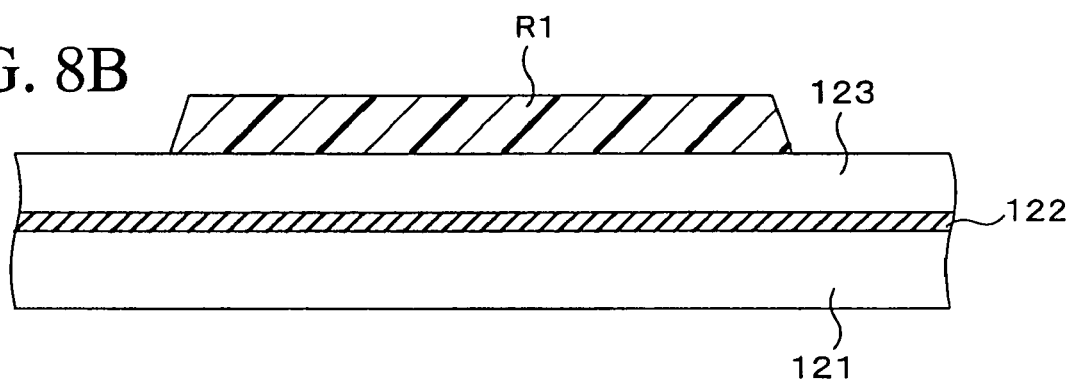
Figure 9B:
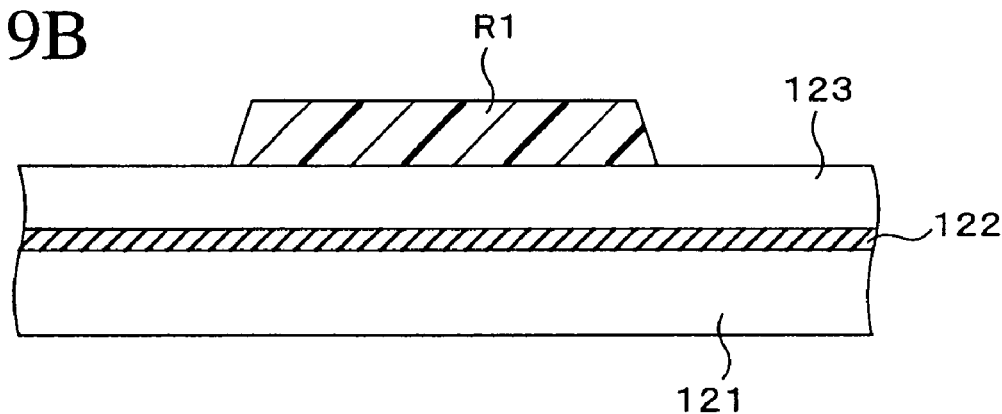

Next, as shown in FIG. 8B and FIG. 9B, excimer laser is irradiated over the entire upper surface of the glass substrate 121 to crystallize the surface, and the amorphous silicon film 123a is changed to the polysilicon film 123. Then, a resist film R1 is formed on a predetermined region (TFT formation region) of the polysilicon film 123 using the positive type photoresist.

Figure 8C:
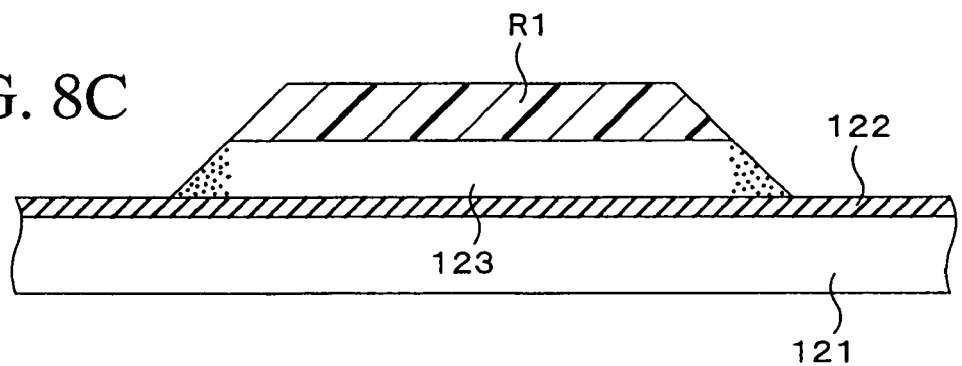
Figure 8D:
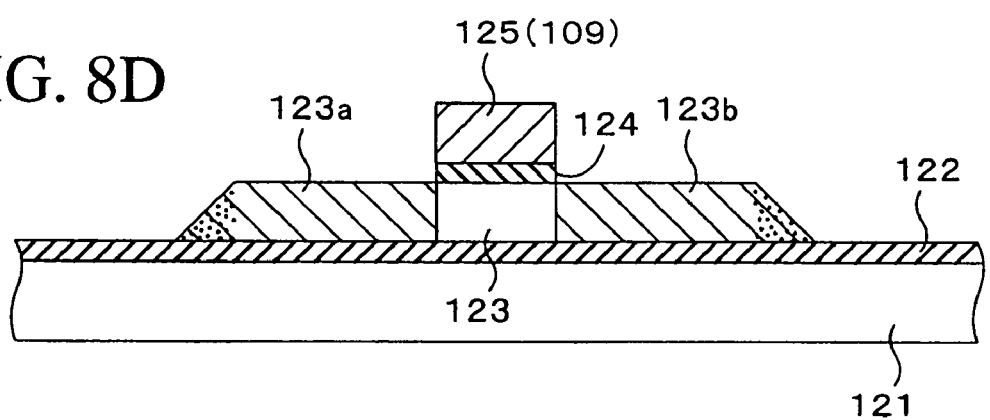
Figure 9C:
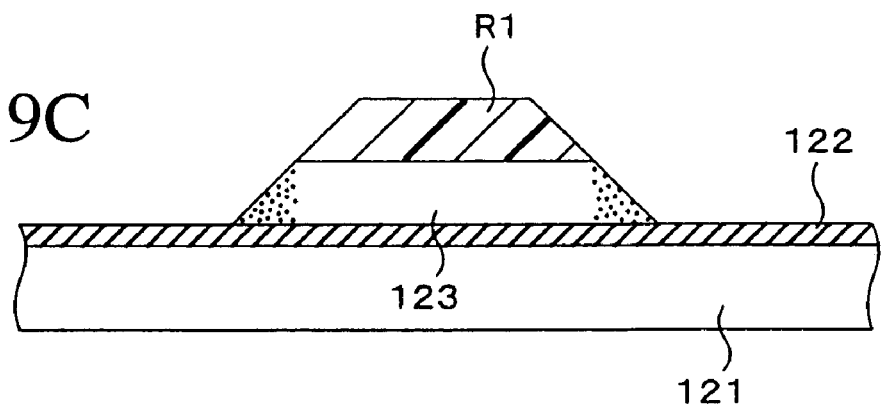
Figure 9D:
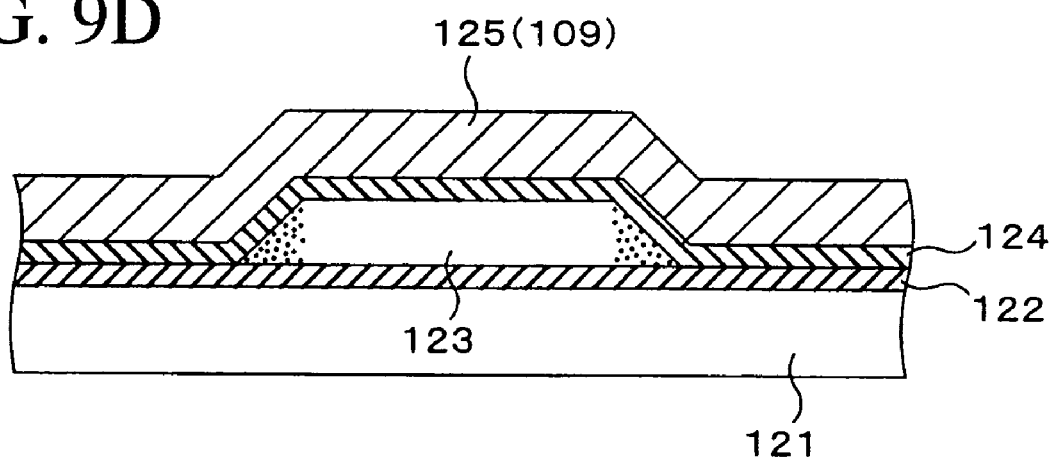
Figure 10A:
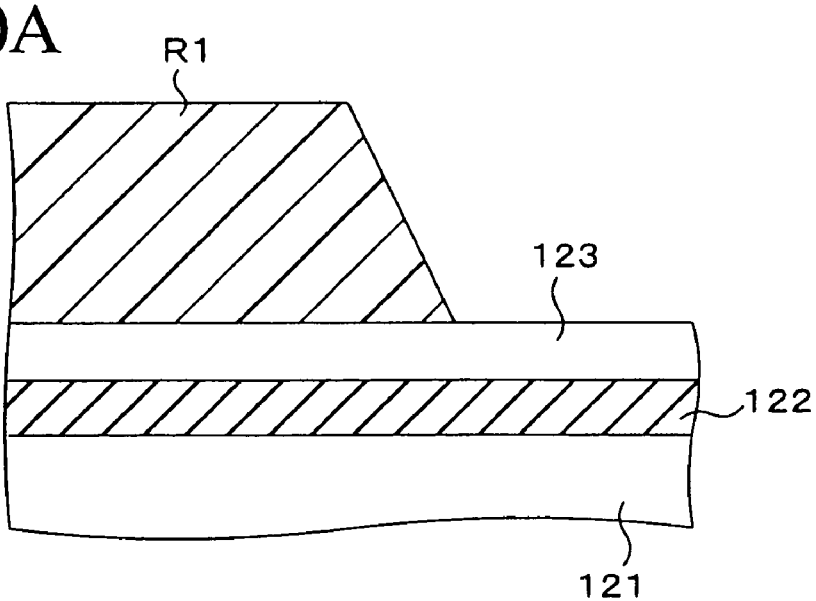
FIGS. 10A to 10C are enlarged sectional views showing a method of introducing impurities into the gradient section of semiconductor film.
Figure 10B:
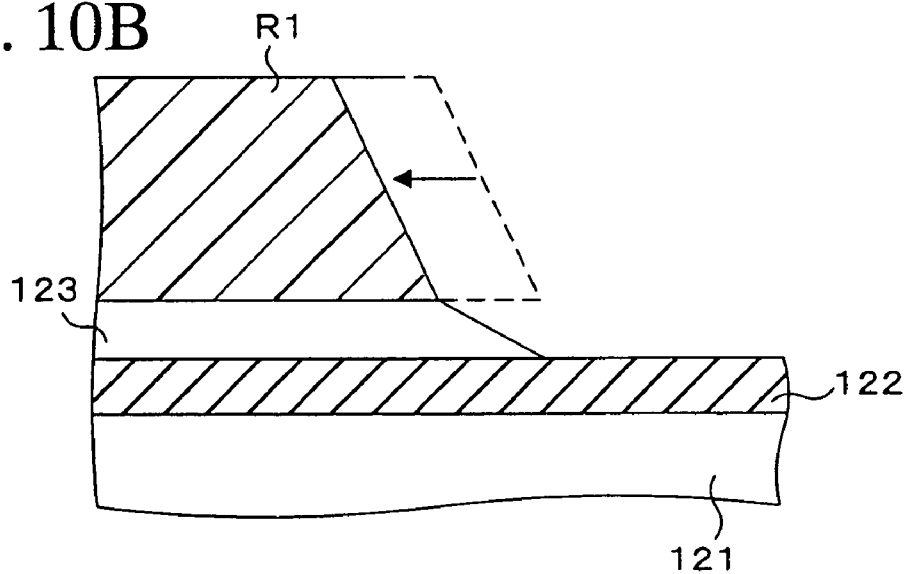

Next, the glass substrate 121 is placed in a dry etching system (not shown). Then, $SF_6$ and oxygen gas, for example, are introduced in the etching system to perform dry etching to the polysilicon film 123 using the resist film R1 as a mask. At this point, as shown in FIG. 10A, gradient whose width becomes smaller generally from the bottom portion to the upper portion is created at the edge portion of the resist film R1, and the gradient surface gradually withdraws as it is etched in plasma containing oxygen, as shown in FIG. 10B. With this withdrawal, gradient is created at the edge portion of the polysilicon film 123 as well as shown in FIG. 8C and FIG. 9C. The polysilicon film 123 having the gradient at the edge portion is formed in this manner.

Figure 10C:
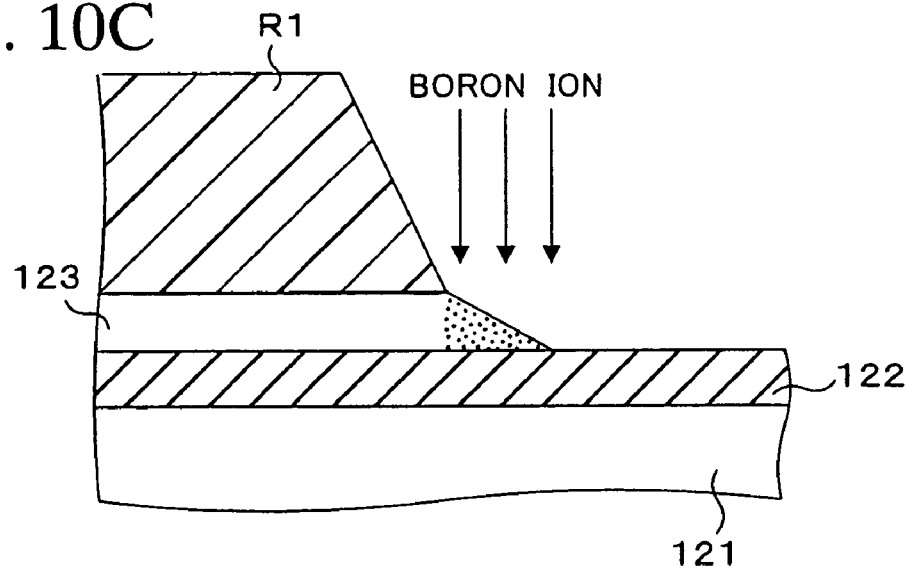

Next, boron is implanted into the polysilicon film 123 using an ion doping system on condition that acceleration voltage is 5 kV, dosage is $2 \times 10^{12}$ $cm^{-2}$. Accordingly, boron is not introduced into a part of the polysilicon film 123, which is masked by the resist film R1, boron is selectively introduced only into the edge portion (gradient section) of the polysilicon film 123 as shown in FIG. 10C. The volume density of boron in the gradient section of the polysilicon film 123 is approximately $1 \times 10^{18}$ $cm^{-3}$ together with the one created in the previous vapor-phase doping. This density is equivalent to approximately 2.5 times the volume density of boron in the channel flat section.

Incidentally, when the edge portion of the polysilicon film 123 is not sufficiently exposed from the resist film R1 after dry etching, the resist film R1 is entirely etched in oxygen plasma, for example, to make the edge portion of the resist film R1 withdraw, and the polysilicon film 123 may be sufficiently exposed.

After boron has been introduced only into the gradient section of the polysilicon film 123 in this manner, resist film R1 is removed by plasma ashing or the like.

Next, an $SiO_2$ film that is the gate insulating film 124 is formed in the thickness of approximately 100 nm on the polysilicon film 123. Subsequently, an aluminum film is formed on the $SiO_2$ film by a sputtering method, for example, in the thickness of approximately 400 nm. Then, patterning is performed to the aluminum film and the $SiO_2$ film by the photolithography method to form the gate electrode 125 (gate bus line 109) and the gate insulating film 124.

Note that predetermined wirings (first layer wirings) are formed simultaneously with forming the gate electrode 125 in a dive circuit formation region outside the display section.

Next, ion implantation of phosphorous (P) as the n-type impurities is performed into the polysilicon film 123 using the gate electrode 125 as a mask to form a pair of the high-concentration impurity regions (123a, 123b) that become source/drain. At this point, a so-called LDD (Lightly Doped Drain) region having low impurity concentration may be formed between the high-concentration impurity regions (123a, 123b) and the channel region.

After having formed the n-type TFT in this manner, the resist film where only the p-type TFT formation region is exposed is formed on the glass substrate 121. Then, ion implantation of boron, for example, as the p-type impurities is performed into the polysilicon film 123 in the p-type TFT formation region in the concentration twice or more that of phosphorous (P) previously implanted, and thus the p-type TFT is formed. According to this method, the n-type TFT and the p-type TFT can be formed with a relatively small number of processing.

Alternatively, ion implantation of the p-type impurities is previously performed to the polysilicon film 123 in the n-type TFT formation region and the p-type TFT formation region. And then, the p-type TFT formation region is covered with the resist film, the n-type impurities are implanted into the n-type TFT formation region in the concentration twice or more that of the p-type impurities, and the n-type TFT thus may be formed.

Next, thermal treatment is performed at 300° C. to 600° C. to activate the impurities implanted into the polysilicon film 123. The impurities may be activated by processing such as laser irradiation or lamp anneal instead of regular thermal treatment.

Figure 8E:
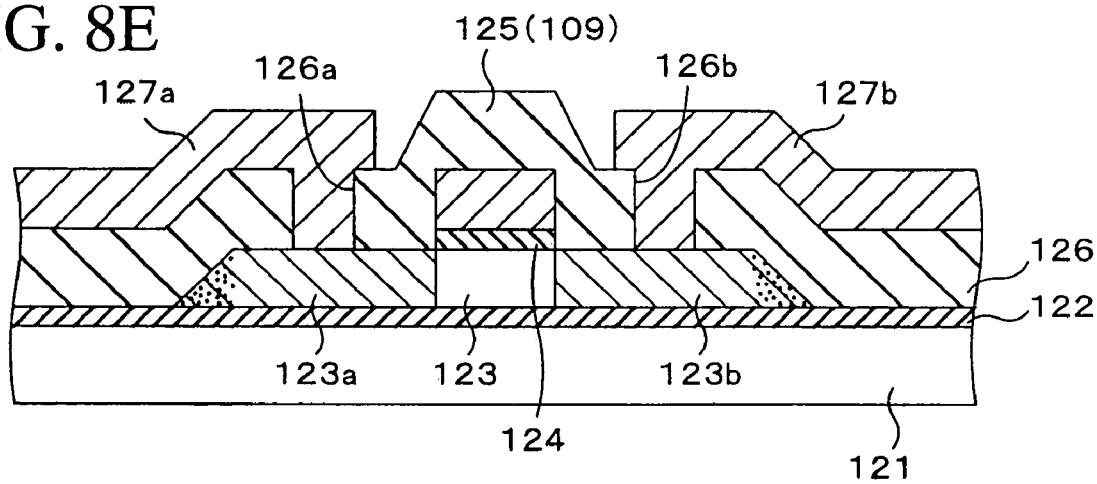
Figure 9E:
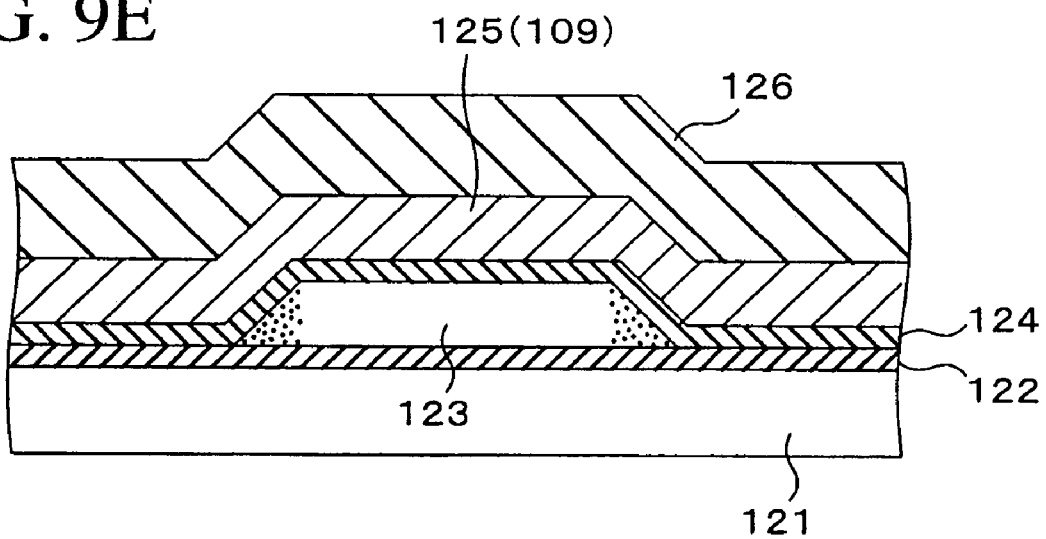

Next, as shown in FIG. 8E and FIG. 9E, a silicon nitride film (SiN) having the thickness of 400 nm as the first interlayer insulating film 126 is formed over the entire upper surface of the substrate 121, and the contact holes (126a, 126b) reaching the high-concentration impurity regions (123a, 123b) from the surface of the first interlayer insulating film 126 are formed.

Next, Ti (30 nm), Al (300 nm), and Mo (50 nm) are formed in this order to form a metal layer of a three-layer structure. Then, patterning is performed to the metal film to form the data bus line 108, the source electrode 127a, and the drain electrode 127b.

At this point, predetermined wirings (second layer wirings) are formed simultaneously in the drive circuit formation region outside the display section.

Next, as shown in FIG. 7, the silicon nitride film or the silicon oxide film is formed as the second interlayer insulating film 128 over the entire upper surface of the substrate 121 in the thickness of 200 nm to 300 nm, and the contact hole 128a is formed at a predetermined position of the second interlayer insulating film 128. Note that organic resin may be used as material of the second interlayer insulating film 128, and two or more kinds of film out of the silicon nitride film, the silicon oxide film, and organic resin film may be laminated to form the second interlayer insulating film 128.

Subsequently, the ITO film is formed over the entire upper surface of the substrate 121, and patterning is performed to the ITO film to form the picture element electrode 129. The picture element electrode 129 is electrically connected to the source electrode 127a via the contact hole 128a.

The TFT substrate manufactured in this manner and the CF substrate, on which the color filter, the common electrode, and the like have been formed, are arranged opposing to each other, liquid crystal is filled between the both substrates, and thus completing the liquid crystal display panel.

Figure 11:
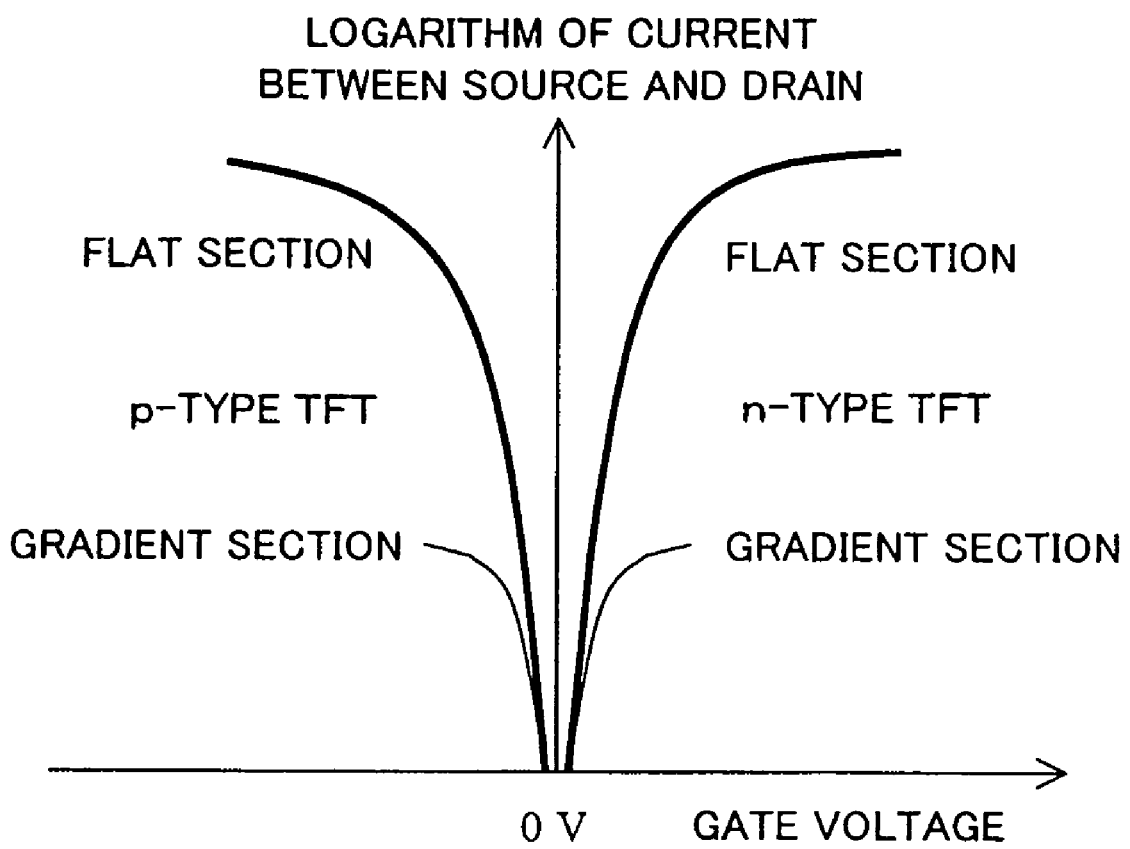
FIG. 11 is a view showing the I-V characteristic of the p-type TFT and the n-type TFT according to the first embodiment.
Figure 12:
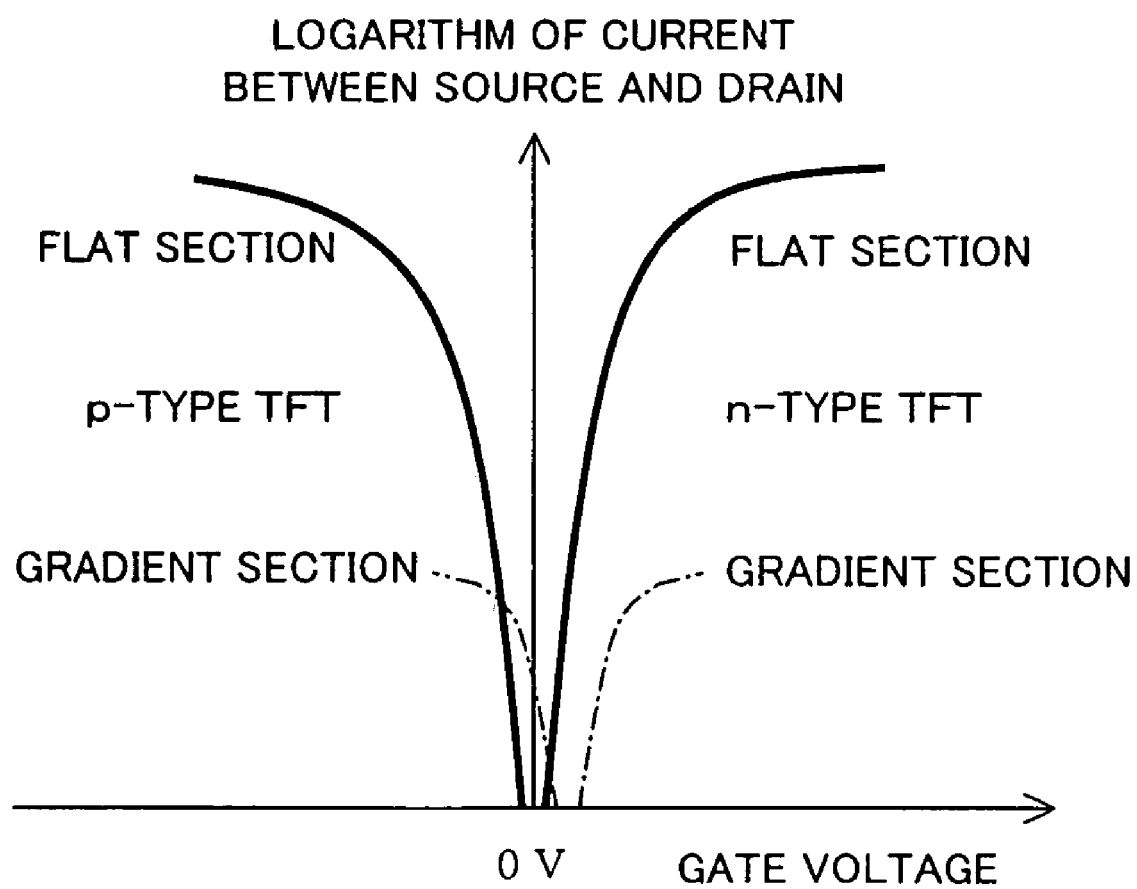
FIG. 12 is a view showing the I-V characteristic when impurity concentration per unit volume at the gradient section of the channel region has exceeded five times the impurity concentration at the flat section.

FIG. 11 shows the current-voltage (I-V) characteristic of the p-type TFT and the n-type TFT of this embodiment. As shown in FIG. 11, p-type impurities are introduced into the gradient section in the channel region more than the flat section so that the surface density of p-type impurities in the gradient section is made to be substantially equal to that of the channel flat section. Accordingly, the threshold of the parasitic transistor formed at the gradient section of the channel region becomes substantially equal to the threshold of the transistor at the flat section, the hump in the I-V characteristic of the TFT disappears, and both the n-type TFT and the p-type TFT turn off when the gate voltage is at 0V. Therefore, effects that leakage current of CMOS reduces and power consumption is significantly reduced can be obtained.

However, when the volume density of the p-type impurities in the gradient section in the channel region is smaller than approximately twice the volume density of the p-type impurities in the flat section, the threshold voltage of the n-type TFT is reduced by the influence by the gradient section as in FIG. 2, and the n-type TFT does not turn off when the gate voltage is at 0V. On the other hand, when the volume density of the p-type impurities in the gradient section in the channel region exceeds approximately five times the volume density of the p-type impurities in the flat section, the influence by the gradient section moves the threshold voltage of the p-type TFT to a plus direction, and the p-type TFT does not turn off when the gate voltage is at 0V. Therefore, it is required that the volume density of the p-type impurities in the gradient section in the channel region be twice to five times the volume density of the p-type impurities in the flat section.

In the above-described embodiment, although the amorphous silicon film containing the p-type impurities has been formed by the vapor-phase doping method in the process shown in FIG. 8A and FIG. 9A, the p-type impurities may be introduced into the amorphous silicon film by the ion implantation method or the ion doping method after formation of a non-dope (impurities have not been introduced) amorphous silicon film. For example, the non-dope amorphous silicon film may be exposed to plasma of diborane gas to introduce the p-type impurities into the amorphous silicon film. Alternatively, the p-type impurities may be introduced into the polysilicon film by the above-described method after formation of the non-dope polysilicon film.

Furthermore, in the process shown in FIG. 8C and FIG. 9C, introduction of the p-type impurities into the gradient section of the polysilicon film 123 has been performed by the ion doping method, but it may be performed by using an ion implanter equipped with mass separation mechanism or an apparatus that introduces boron into a semiconductor film by plasma of diborane gas.

Moreover, the p-type impurities may be an element other than boron (aluminum, for example). In this case, the p-type impurities of the element other than the one introduced into the polysilicon film 123 in the process of FIG. 8A and 9A may be introduced into the gradient section in the polysilicon film 123 in the process shown in FIGS. 8C and 9C.

Still further, when processing the polysilicon film 123 into an island shape, the silicon oxide film may be formed on the polysilicon film 123 in the thickness of approximately 10 nm, for example, as a protective film before forming the resist film R1 to prevent contamination caused by the resist film or the like.

Further, gas such as $CF_4$ and gas containing oxygen may be used other than $SF_6$ as gas for etching the polysilicon film.

Second Embodiment

Figure 13A:
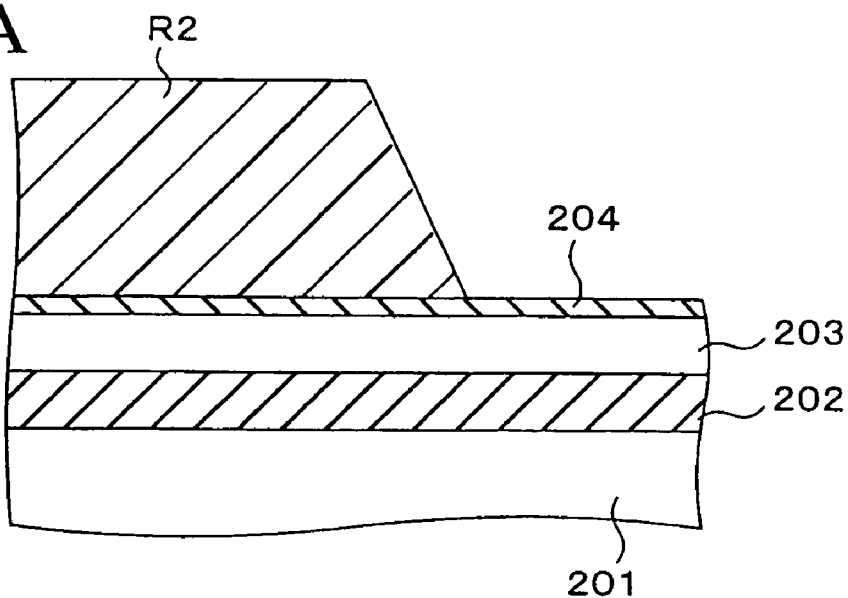
FIGS. 13A to 13C are sectional views showing the manufacturing method of the thin film transistor device of the second embodiment of the present invention in the order of process.
Figure 13B:
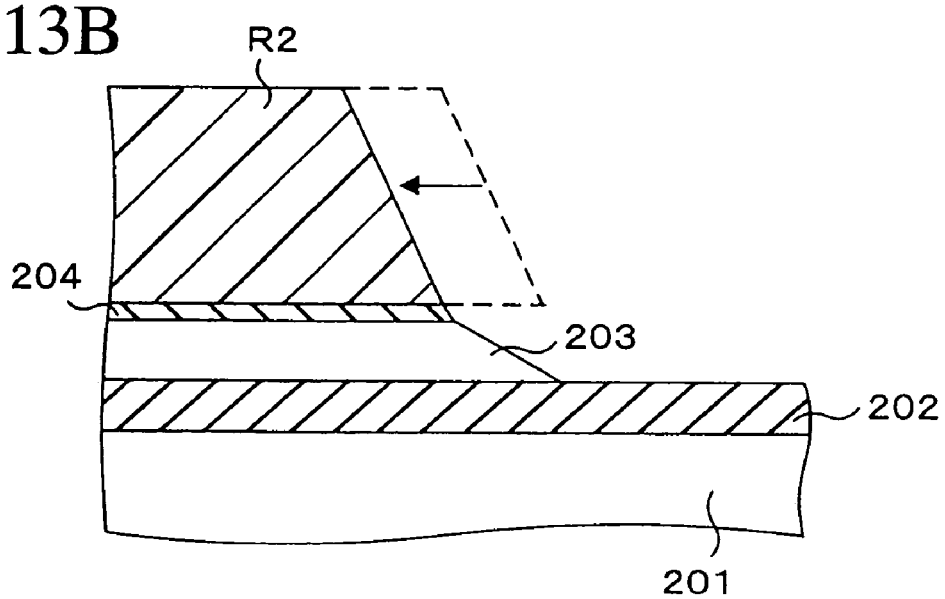
Figure 13C:
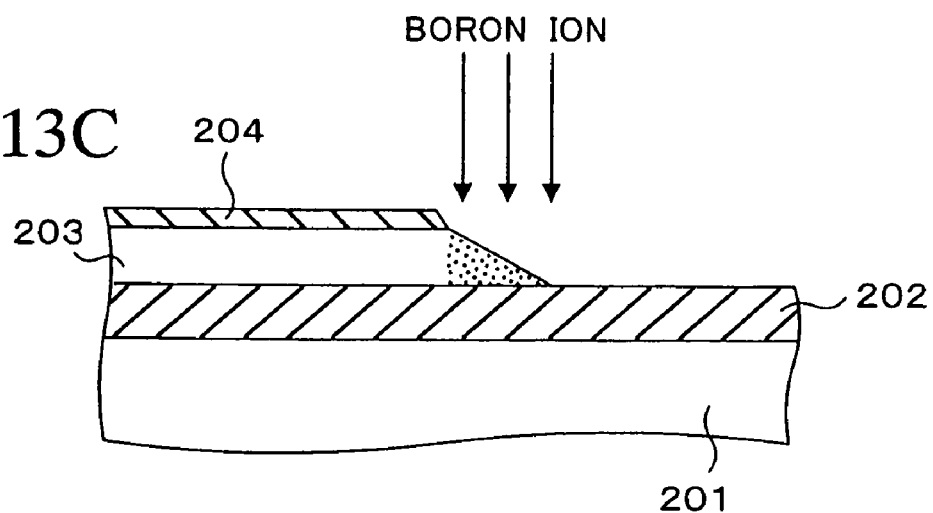

FIGS. 13A to 13C are the sectional views showing the manufacturing method of the thin film transistor device of the second embodiment of the present invention in the order of process.

First, as shown in FIG. 13A, the silicon oxide film is formed in the thickness of approximately 100 nm as an underlying insulating film 202 on a glass substrate 201.

Next, the amorphous silicon film containing boron (B), in the volume density of $4\times10^7$ cm$^{-3}$, is formed on the underlying insulating film 202 in the thickness of approximately 40 nm by the vapor-phase doping method. Subsequently, excimer laser is irradiated over the entire upper surface of the substrate 201 to change the amorphous silicon film to the polysilicon film 203. Then, a mask film 204 made up of the silicon oxide film, for example, is formed on the polysilicon film 203 in the thickness of approximately 25 nm. Although the mask film 204 is formed of insulator in this embodiment, it may be formed by conductive material. Further, the mask film 204 needs a thickness to the extent that it can prevent implantation of the p-type impurities into the flat section of the polysilicon film 203 in the process to introduce the p-type impurities into the gradient section of the polysilicon film 203 (described later).

Next, a resist film R2 is formed on the mask film 204 in the TFT formation region using the positive type photoresist.

Then, the substrate is placed in the dry etching system, and CF$_4$ and oxygen gas, for example, are introduced in the etching system to perform dry etching to the mask film 204 and the polysilicon film 203 into the island shape as shown in FIG. 13B. At this point, gradient whose width becomes smaller from the bottom portion to the upper portion is created at the edge portion of the resist film R2, and the gradient section gradually withdraws as it is etched in plasma containing oxygen. With this withdrawal, gradient as shown in FIG. 13B is created at the edge portion of the polysilicon film 203 as well.

Next, as shown in FIG. 13C, after removal of the resist film R2 by remover, boron (B) is implanted into the polysilicon film 203 using the ion doping system on condition that the acceleration voltage is 5 kV and the dosage is $2\times10^{12}$ cm$^{-2}$. Accordingly, boron is not introduced into the flat section of the polysilicon film 203, which is masked by the mask film 204, boron is introduced only into the gradient section of the polysilicon film 203, which is exposed from the mask film 204. The volume density of boron in the gradient section of the polysilicon film 203 is approximately $1\times10^{18}$ cm$^{-3}$ together with the one introduced in the polysilicon film 203 first. This density is equivalent to approximately 2.5 times the volume density of boron at the channel center (flat section) of the polysilicon film 203.

After having introduced boron only into the gradient section of the polysilicon film 203 in this manner, mask film 204 is removed. Since the subsequent process is the same as that of the first embodiment, its description will be omitted here. In the case where the mask film 204 is made up of the silicon oxide film as in this embodiment, the mask film 204 is not removed but may be used as a part of the gate insulating film.

In this embodiment, since the impurities are implanted into the gradient section of the polysilicon film 203 after the resist film R2 has been removed, the surface of the resist film R2 does not cause alteration due to implantation of the impurities, and thus the resist film R2 can be removed by remover. This makes a removal operation of the resist film easier comparing to the first embodiment. However, the resist film R2 may be removed by plasma ashing in this embodiment as well.

Figure 14:
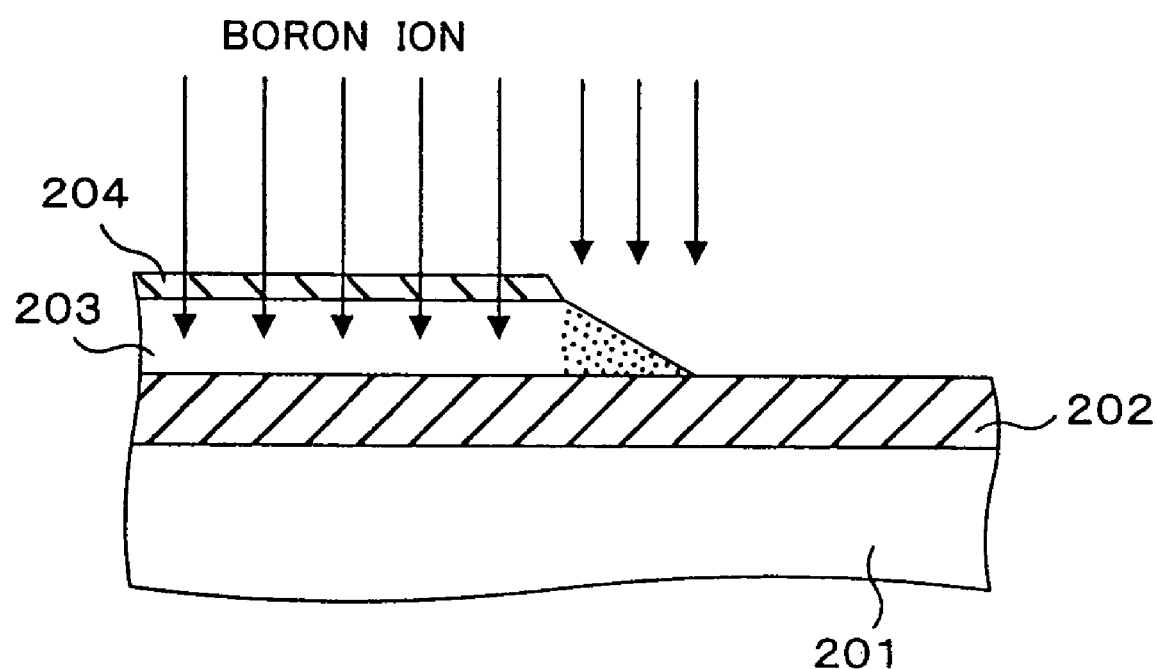
FIG. 14 is a sectional view showing a variation example of the second embodiment.

Furthermore, in this embodiment, the amorphous silicon film into which the impurities have been introduced is formed and laser is irradiated on the amorphous silicon film, and the polysilicon film into which the impurities for controlling the threshold is thus formed. However, as shown in FIG. 14, the non-dope polysilicon film 203 is formed and the p-type impurities for controlling the threshold may be introduced over the entire polysilicon film 203 by the ion doping method or the like. For example, when boron is introduced in the entire polysilicon film 203, the acceleration voltage and the dosage are set to 25 kV and $3\times10^{12}$ cm$^{-2}$ respectively. Boron ion transmits through the mask film 204 and is implanted into the polysilicon film 203 under these conditions. Further, when boron is introduced only into the gradient section of the polysilicon film 203 (the portion protruded from the mask film 204), the acceleration voltage and the dosage are set to 5 kV and $2\times10^{12}$ cm$^{-2}$ respectively.

As a result, the volume density of boron that the center (flat section) of the polysilicon film 203 contains is approximately $4\times10^{17}$ cm$^{-3}$ and the volume density of boron in the gradient section is approximately $1\times10^{18}$ cm$^{-3}$.

Generally, when doping a small quantity of impurities into the silicon film as in the case of controlling the threshold, the ion doping method or the ion implantation method has superior controllability of impurities dosage comparing to the vapor-phase doping method using diborane gas, and can control the threshold of the TFT with good accuracy.

Furthermore, in this embodiment, boron (B) is implanted into the gradient section of the polysilicon film 203 by ion doping using the mask film 204 as a mask. In the ion doping, since most ions are implanted in the state of B$_2$ Hx$^+$ (x is an integer), shallow implantation can be performed comparing to the case where mass separation is performed and implantation is performed in B$^+$ ion, and therefore, the mask film 204 can be used as a mask.

However, it is possible to adopt the ion implantation method equipped with the mass separation mechanism by appropriately setting the thickness of the mask film 204 and the acceleration voltage. Furthermore, introduction of boron into the gradient section of the polysilicon film 203 can be performed by plasma processing using diborane gas.

Third Embodiment

Figure 15A:
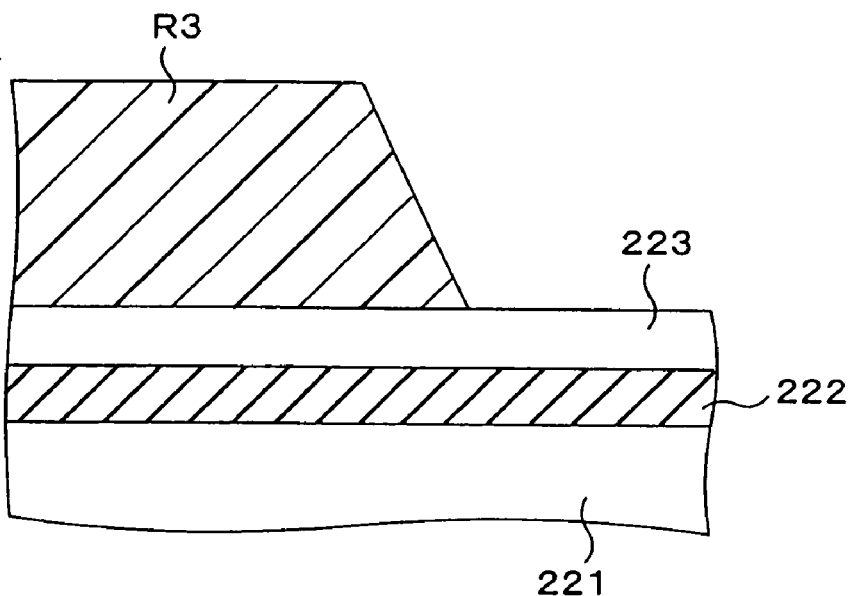
FIGS. 15A to 15C are sectional views showing the manufacturing method of the TFT of the third embodiment according to the present invention in the order of process.
Figure 15B:
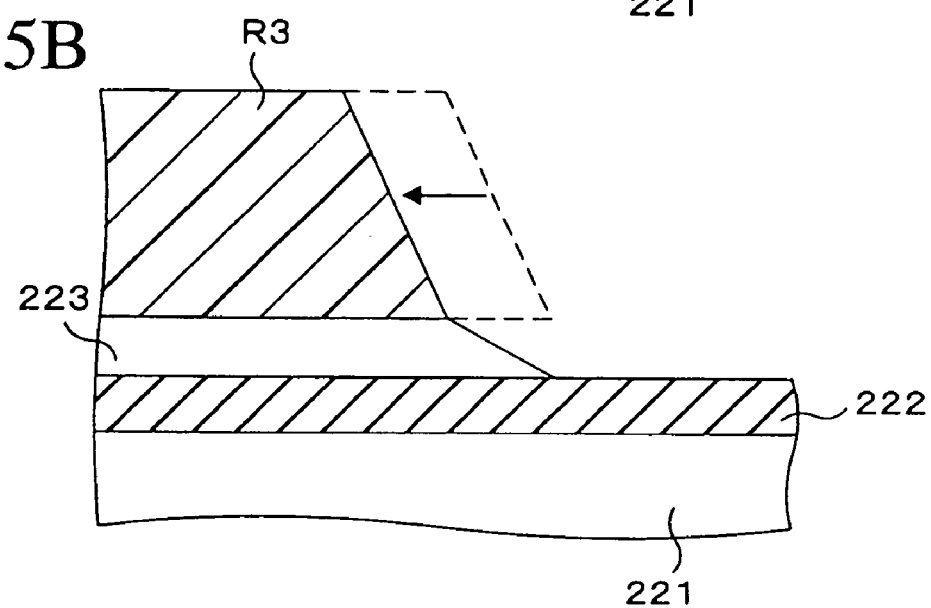
Figure 15C:
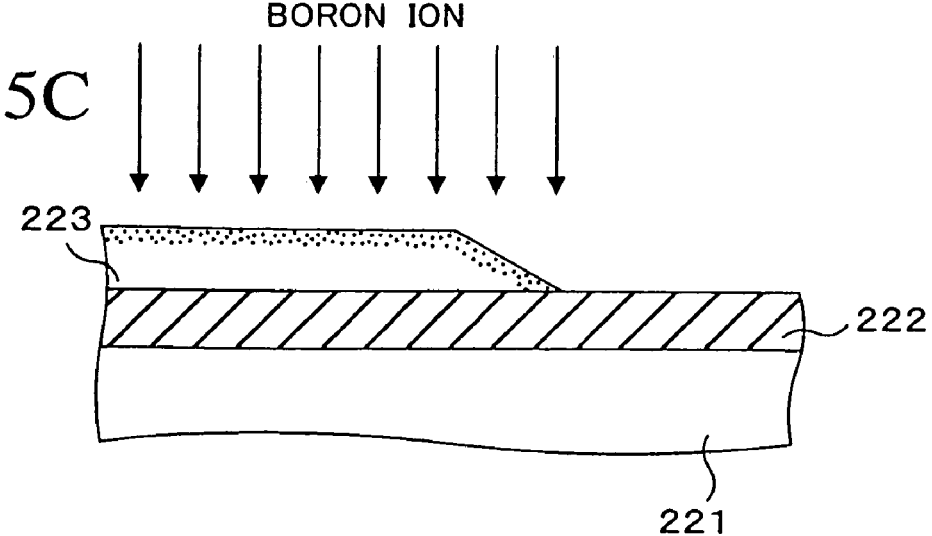

FIGS. 15A to 15C are the sectional views showing the manufacturing method of the thin film transistor device of the third embodiment according to the present invention in the order of process.

First, as shown in FIG. 15A, the silicon oxide film is formed in the thickness of approximately 100 nm as an underlying insulating film 222 on a glass substrate 221, in the same manner as the first embodiment.

Next, the non-dope amorphous silicon film is formed on the underlying insulating film 222 in the thickness of approximately 40 nm. Subsequently, excimer laser is irradiated over the entire upper surface of the glass substrate 221 to change the amorphous silicon film to the polysilicon film 223. Then, a resist film R3 is formed on the polysilicon film 223 in the TFT formation region using the positive type photoresist.

Next, the substrate 221 is placed in the dry etching system, SF$_6$ and oxygen gas, for example, are introduced in the dry etching system to perform etching to the polysilicon film 223 into the island shape. At this point, gradient whose width becomes smaller from the bottom portion to the upper portion is created at the edge portion of the resist film R3, and the gradient surface gradually withdraws as it is etched in plasma containing oxygen. With this withdrawal, gradient is created at the edge portion of the polysilicon film 223 as well as shown in FIG. 15B.

Next, as shown in FIG. 15C, after removal of the resist film R3 by remover, plasma ashing, or the like, boron is introduced into a portion close to the surface of the channel flat section and the gradient section of the polysilicon film 223 using the ion doping system on condition that the acceleration voltage is 5 kV and the dosage is $1.5 \times 10^{12}$ cm$^{-2}$.

Since the process after having introduced boron into the flat section and the gradient section of the polysilicon film 223 in this manner is the same as the first embodiment, its description will be omitted here.

In this embodiment, boron is introduced into the flat section and the gradient section of the channel region of the polysilicon film 223 such that a peak of distribution appears in the vicinity of the surface thereof. This makes the surface density of boron in the flat section and the gradient section of the channel region become substantially equal to each other, and hump occurrence in the current-voltage (I-V) characteristic can be restricted. In addition, introduction of the p-type impurities into the flat section for controlling the threshold and introduction of the p-type impurities into the gradient section for restricting humps are performed in the same process, which prevents the number of process from increasing.

Note that boron has introduced into the vicinity of the surface of the polysilicon film 223 using the ion doping system in this embodiment. However, the impurities may be introduced into the surface of the polysilicon film 223 by the ion implantation method or the plasma processing using diborane gas.

Incidentally, to make controlling of the threshold easier, the p-type impurities for controlling the threshold is introduced into the n-type TFT more than the p-type TFT, and the difference between the threshold of the n-type TFT and the threshold of the p-type TFT can be made large.

This technique can be used at the same time in any of the first to the third embodiments. An example where the technique is applied for the third embodiment will be described as follows.

In the process shown in FIG. 15C, the conditions when boron is introduced into the portion close to the surface of the flat section and the gradient section of the polysilicon film 223 are the acceleration voltage of 5 kV and the dosage of $1 \times 10$ cm$^{-2}$.

Next, the resist mask, which covers the p-type TFT formation region and which the n-type TFT formation region is exposed, is formed on the upper portion of the substrate 221. Then boron is implanted into the polysilicon film in the n-type TFT formation region on condition that the acceleration voltage is 5 kV and the dosage is $1 \times 10^{12}$ cm$^{-2}$.

As a result, since the surface density of boron in polysilicon film 223 of the p-type TFT becomes $1 \times 10^{12}$ cm$^{-2}$, the threshold moves to a minus direction from the above-described case by approximately 0.5 V to 1V. On the other hand, because boron of $2 \times 10^{12}$ cm$^{-2}$ is introduced into the polysilicon film 223 of the n-type TFT by two-time implantation, the threshold increases by approximately 0.5V to 1V from the above-described case and the difference between the thresholds of the n-type TFT and the p-type TFT becomes larger by 1V to 2V. However, a resist mask process is added when adopting such technique.

Figure 16:
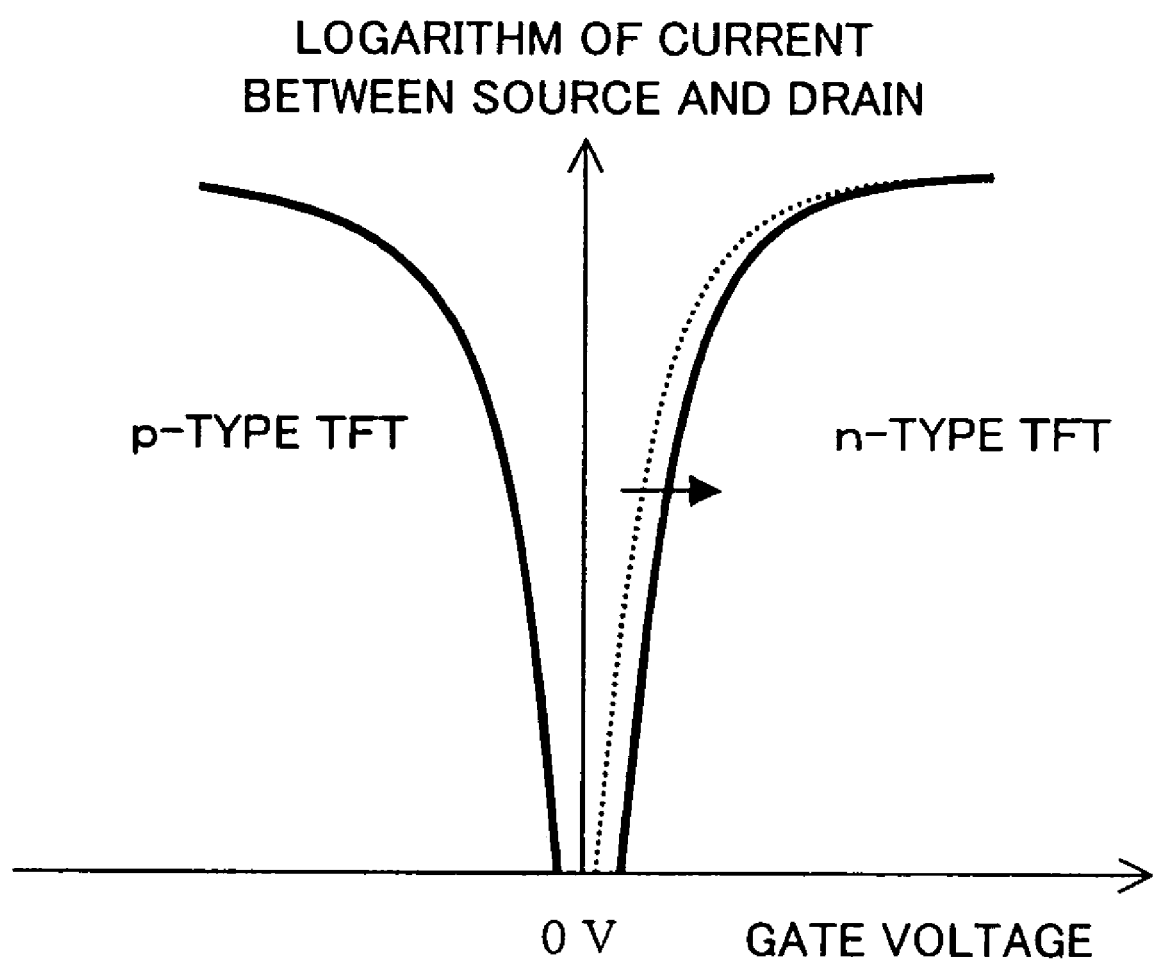
FIG. 16 is a view showing the I-V characteristic when the quantity of p-type impurities in the channel region of the n-type TFT is larger than the quantity of p-type impurities in the channel region of the p-type TFT.

FIG. 16 is the view showing the current-voltage I-V characteristic when the quantity of p-type impurities in the channel region of the n-type TFT is larger than the quantity of p-type impurities in the channel region of the p-type TFT. As shown in FIG. 16, by making the quantity of p-type impurities in the channel region of the n-type TFT become larger than the quantity of p-type impurities in the channel region of the p-type TFT, the threshold voltage of the n-type TFT increases. Therefore, the quantity of the impurities in the channel section can be easily controlled so as to turn off both of the p-type TFT and the n-type TFT when the gate voltage is 0V.

Fourth Embodiment

FIGS. 17A to 17D are the sectional views showing the manufacturing method of the thin film transistor device of the fourth embodiment according to the present invention.

Figure 17A:
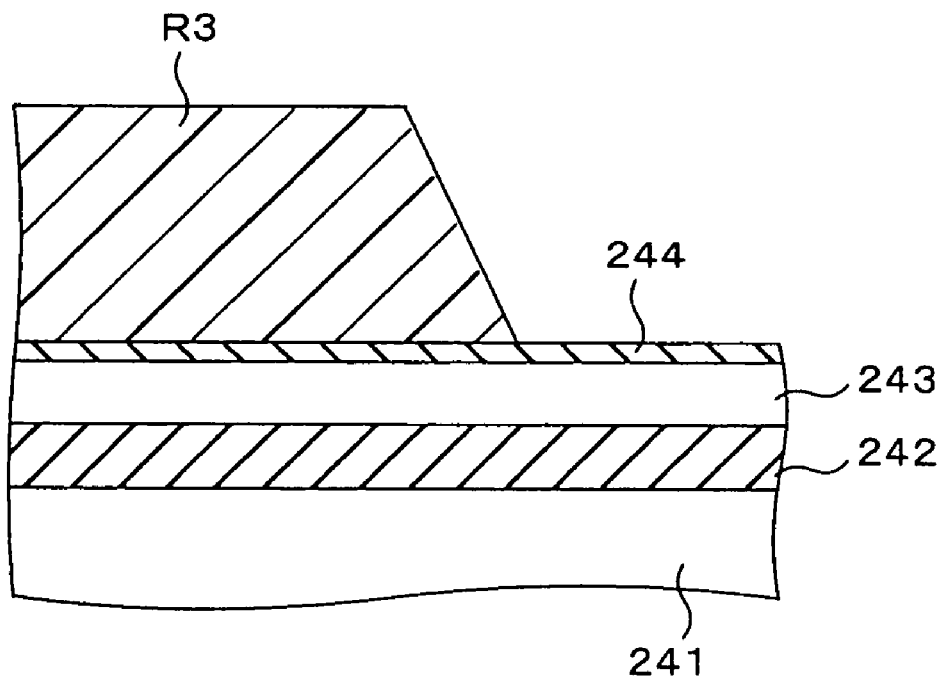
FIGS. 17A to 17D are sectional views showing the manufacturing method of the thin film transistor of the fourth embodiment of the present invention.

First, as shown in FIG. 17A, the silicon oxide film is formed in the thickness of approximately 100 nm as an underlying insulating film 242 on a glass substrate 241, in the same manner as the first embodiment.

Next, the amorphous silicon film containing boron in the density of $3 \times 10^{17}$ cm$^{-3}$ is formed on the underlying insulating film 242 in the thickness of approximately 40 nm. In this embodiment, the density of boron in the amorphous silicon film is smaller comparing to the first embodiment.

Subsequently, excimer laser is irradiated over the entire upper surface of the substrate 241 to change the amorphous silicon film to a polysilicon film 243. Then, a mask film 244 made up of the silicon oxide film, for example, is formed in the thickness of approximately 25 nm on the polysilicon film 243.

Figure 17B:
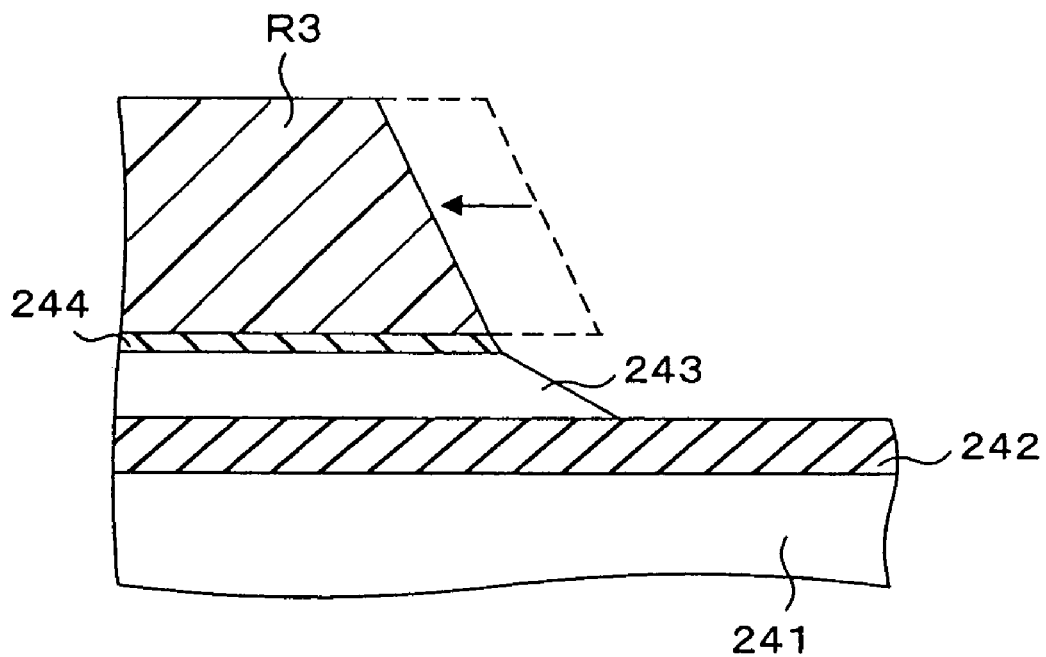

Next, a resist film R3 is formed on the mask film 244 in the TFT formation region using the positive type photoresist. Then, the substrate 241 is placed in the dry etching system, CF$_4$ and oxygen gas, for example, are introduced in the dry etching system to perform etching to the mask film 244 and the polysilicon film 243 into the island shape. At this point, gradient whose width becomes smaller from the bottom portion to the upper portion is created at the edge portion of the resist film R3, and the gradient surface gradually withdraws as it is etched in plasma containing oxygen. With this withdrawal, gradient is created at the edge portion of the polysilicon film 243 as well as shown in FIG. 17B.

Figure 17C:
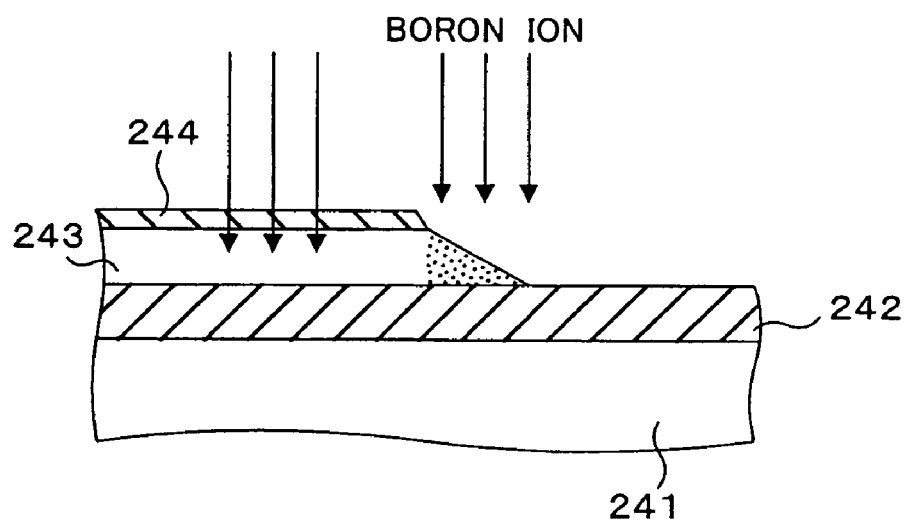
Figure 17D:
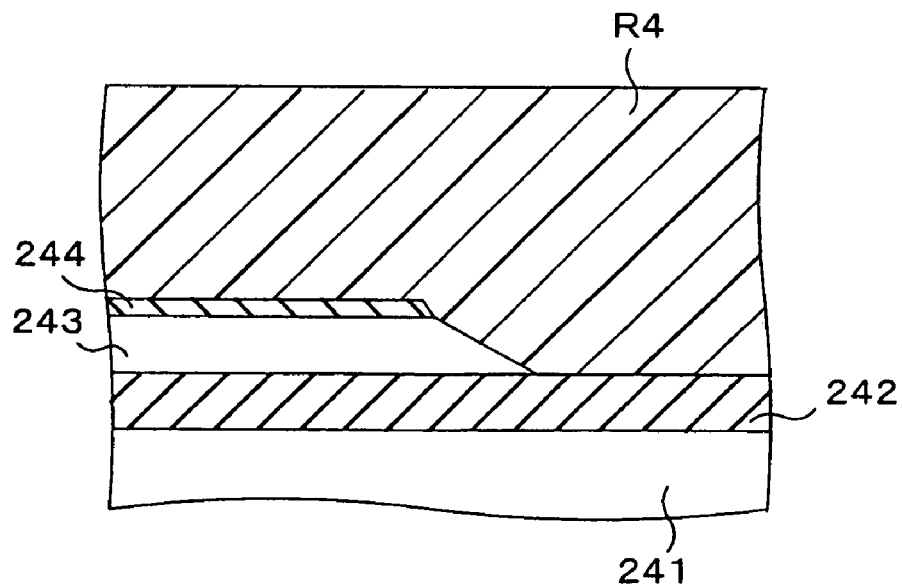

Next, the resist film R3 is removed by remover, plasma ashing, or the like. Then, a resist film R4, which covers the p-type TFT formation region and at which the n-type TFT is exposed, is formed as shown in FIGS. 17C and 17D.

Then, boron is introduced into the entire polysilicon film 243 in the n-type TFT formation region using the ion doping system on condition that the acceleration voltage is 25 kV and the dosage is $1.6 \times 10^{12}$ cm$^{-2}$. Subsequently, boron is implanted only into the gradient section of the polysilicon film 243 in the n-type TFT formation region on condition that the acceleration voltage is 5 kV and the dosage is $3 \times 10^{12}$ cm$^{-2}$.

Thus, boron is introduced in the channel region of the p-type TFT in the density of $3 \times 10^{17}$ cm$^{-3}$, and boron of approximately $5 \times 10^{17}$ cm$^{-3}$ and approximately $1.6 \times 10^{18}$ cm$^{-3}$ are introduced into the channel flat section of the n-type TFT and the channel gradient section of the n-type TFT respectively. As a result, the difference between the thresholds of the n-type TFT and the p-type TFT becomes larger by approximately 1V to 1.5V comparing to the first embodiment.

Next, the resist film R4 and the mask film 244 are removed. Since the subsequent process is the same as the first embodiment, its description will be omitted here.

In this embodiment, the gate insulating film has been formed on the polysilicon film 243 after removal of the mask film 244 as well. However, the mask film 244 may be kept as it is as a part of the gate insulating film in the same manner as the second embodiment when the mask film 244 is made up of insulating film such as the silicon oxide film.

In this embodiment, the p-type impurities for controlling humps are selectively introduced only into the gradient section of the polysilicon film in the n-type TFT formation region, so that the hump does not occur in the p-type TFT and margin for the dosage of the p-type impurities becomes large. Thus, the threshold can be easily controlled. Moreover, p-type impurities are introduced into the channel flat section of the n-type TFT more than the channel flat section of the p-type TFT, and thus the difference between the thresholds of the n-type TFT and the p-type TFT can be made to be large. This further facilitates threshold control.

In this case, introduction of the impurities into the polysilicon film may be performed by the ion implantation method, and introduction of the impurities into the gradient section of the polysilicon film may be performed by plasma processing by diborane gas as well.

Further, although the amorphous silicon film containing the p-type impurities has been formed by the vapor-phase doping method in this embodiment, the impurities may be introduced into the amorphous silicon film by the ion implantation method or the ion doping method after having formed the non-dope amorphous silicon film. Furthermore, the impurities may be introduced into the polysilicon film by the ion implantation method or the ion doping method after having formed the non-dope poly silicon film.

The above-described first to fourth embodiments can be applied for the thin film transistor having the inversely staggered TFT. In this case, the semiconductor film is formed after the gate electrode and the gate insulating film have been formed. Although description has been made for the TFT where the operation layer was made up of the polysilicon film in all of the first to fourth embodiments, the present invention can be also applied for the TFT where the operation layer is made up of the amorphous silicon film or other types of semiconductor film.

Moreover, description has been made for the case where the present invention was applied for the liquid crystal display panel in all of the first to fourth embodiments, the present invention can be also applied for the organic EL display panel or an apparatus using other types of TFT.

What is claimed is:

1. A method of manufacturing a thin film transistor device, comprising the steps of:
    forming a semiconductor film above a substrate;
    introducing p-type impurities for controlling a threshold value into said semiconductor film;
    forming a resist film on a thin film transistor formation region of said semiconductor film;
    etching said semiconductor film using said resist film as a mask to form a tapered edge portion of said semiconductor film protruding from said resist film;
    introducing p-type impurities for controlling a threshold value into said protruding edge portion using said resist film as a mask;
    removing said resist film;
    forming a gate insulating film; and
    forming a gate electrode.

2. The method of manufacturing a thin film transistor device according to claim 1, wherein said step of etching is performed by dry etching using any one of gas containing $SF_6$ and oxygen, and gas containing $CF_4$ and oxygen.

3. The method of manufacturing a thin film transistor device according to claim 1, further comprising the step of:
    etching said resist film to withdraw the edge portion of said resist film after said step of etching.

4. A method of manufacturing a thin film transistor device, comprising the steps of:
    forming a semiconductor film above a substrate;
    introducing p-type impurities for controlling a threshold value into said semiconductor film
    forming a mask film on said semiconductor film;
    forming a resist film on a thin film transistor formation region of said mask film;
    etching said mask film and said semiconductor film using said resist film as a mask to form a tapered edge portion of said semiconductor film protruding from said resist film;
    removing said resist film;
    introducing p-type impurities for controlling a threshold value into said protruding edge portion using said mask film as a mask;
    forming a gate insulating film; and
    forming a gate electrode.

5. The method of manufacturing a thin film transistor device according to claim 4, wherein said gate insulating film is formed on said semiconductor film after removing said mask film.

6. The method of manufacturing a thin film transistor device according to claim 4, wherein said gate insulating film is formed on said semiconductor film while using said mask film as a part of the gate insulating film.

7. The method of manufacturing a thin film transistor device according to claim 4, wherein said step of etching is performed by dry etching using gas containing $CF_4$ and oxygen.

8. A method of manufacturing a thin film transistor device, comprising the steps of:
    forming a semiconductor film above a substrate;
    forming a mask film on said semiconductor film;
    forming a resist film on a thin film transistor formation region of said mask film;
    etching said mask film and said semiconductor film using said resist film as a mask to form a tapered edge portion of said semiconductor film protruding from said resist film;
    removing said resist film;
    introducing p-type impurities for controlling a threshold value into the entire said semiconductor film on condition that the impurities transmit through said mask film, and introducing the p-type impurities for controlling the threshold value only into said protruding edge portion on condition that the impurities are blocked by said mask film;
    forming a gate insulating film; and
    forming a gate electrode.

9. The method of manufacturing a thin film transistor device according to claim 8, wherein
    introduction of the p-type impurities into said semiconductor film is performed by any one of an ion implantation method and an ion doping method.

10. A method of manufacturing a thin film transistor device, comprising the steps of:
    forming a semiconductor film above a substrate;
    forming a resist film on a thin film transistor formation region of said semiconductor film;
    etching said semiconductor film using said resist film as a mask to form a tapered edge portion of said semiconductor film protruding from said resist film;
    removing said resist film;
    introducing p-type impurities for controlling a threshold value into said semiconductor film on condition that a peak of distribution appears in the vicinity of a surface of said semiconductor film;

forming a gate insulating film; and forming a gate electrode.

11. A method of manufacturing a thin film transistor device, comprising the steps of:

forming a semiconductor film above a substrate;

introducing p-type impurities for controlling a threshold value into said semiconductor film;

forming a mask film on said semiconductor film;

forming a first resist film on a p-type thin film transistor formation region and an n-type thin film transistor formation region of said mask film;

etching said semiconductor film and said mask film using said first resist film as a mask to form a tapered edge portion of said semiconductor film protruding from said first resist film and said mask film;

removing said first resist film;

covering the p-type thin film transistor formation region above said substrate with a second resist film;

introducing p-type impurities for controlling a threshold value into the entire said semiconductor film of said n-type thin film transistor formation region on condition that the impurities transmit through said mask film, and introducing the p-type impurities for controlling the threshold value into said protruding portion from said mask film of said semiconductor film of said n-type thin film transistor formation region on condition that the impurities are blocked by said mask film;

removing said second resist film;

forming a gate insulating film; and forming a gate electrode.

12. The method of manufacturing a thin film transistor device according to claim 1, wherein the volume density of the p-type impurities in said protruded portion from said resist film of said semiconductor film is made to be twice to five times the volume density of the p-type impurities in the portion under said resist film of said semiconductor film after the p-type impurities are introduced into said protruded portion from said resist film of said semiconductor film using said resist film as a mask.

13. The method of manufacturing a thin film transistor device according to claim 4, wherein the volume density of the p-type impurities in said protruded portion from said mask film of said semiconductor film is made to be twice to five times the volume density of the p-type impurities in the portion under said mask film of said semiconductor film after the p-type impurities are introduced into said protruded portion from said mask film of said semiconductor film using said mask film as a mask.

14. The method of manufacturing a thin film transistor device according to claim 8, wherein the volume density of the p-type impurities in said protruded portion from said mask film of said semiconductor film is made to be twice to five times the volume density of the p-type impurities in the portion under said mask film of said semiconductor film after the p-type impurities are introduced only into said protruded portion from said mask film of said semiconductor film on condition that the impurities are blocked by said mask film.

15. The method of manufacturing a thin film transistor device according to claim 11, wherein the volume density of the p-type impurities in said protruded portion from said mask film of said semiconductor film of said n-type thin film transistor formation region is made to be twice to five times the volume density of the p-type impurities in the portion under said mask film of said semiconductor film of said n-type thin film transistor formation region after the p-type impurities are introduced into said protruded portion from said mask film of said semiconductor film of said n-type thin film transistor formation region on condition that the impurities are blocked by said mask film.

* * * * *